United States Patent
Kang

(10) Patent No.: US 12,495,671 B2
(45) Date of Patent: Dec. 9, 2025

(54) LIGHT EMITTING DISPLAY DEVICE

(71) Applicant: LG Display Co., Ltd., Seoul (KR)

(72) Inventor: Seogshin Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 568 days.

(21) Appl. No.: 17/975,331

(22) Filed: Oct. 27, 2022

(65) Prior Publication Data

US 2023/0217696 A1 Jul. 6, 2023

(30) Foreign Application Priority Data

Dec. 30, 2021 (KR) .................. 10-2021-0192861
Jul. 25, 2022 (KR) .................. 10-2022-0091701

(51) Int. Cl.
| | |
|---|---|
| H01L 51/52 | (2006.01) |
| H10K 50/86 | (2023.01) |
| H10K 59/122 | (2023.01) |
| H10K 59/124 | (2023.01) |
| H10K 59/131 | (2023.01) |

(52) U.S. Cl.
CPC .......... *H10K 50/86* (2023.02); *H10K 59/122* (2023.02); *H10K 59/124* (2023.02); *H10K 59/131* (2023.02)

(58) Field of Classification Search
None
See application file for complete search history.

(56) References Cited

U.S. PATENT DOCUMENTS

| | | | |
|---|---|---|---|
| 7,652,423 | B2 | 1/2010 | Kobayashi |
| 2002/0180349 | A1* | 12/2002 | Aziz ............. H10K 50/826 313/506 |
| 2005/0067953 | A1 | 3/2005 | Yamazaki et al. |
| 2006/0012295 | A1 | 1/2006 | Kobayashi |
| 2009/0267503 | A1 | 10/2009 | Kobayashi |
| 2014/0339521 | A1 | 11/2014 | Ozawa |
| 2016/0248039 | A1 | 8/2016 | Choung et al. |
| 2016/0372528 | A1 | 12/2016 | Kamura et al. |

FOREIGN PATENT DOCUMENTS

| | | | |
|---|---|---|---|
| JP | 2005-085739 A | 3/2005 | |
| KR | 10-2006-0047486 A | 5/2006 | |
| WO | WO-2013038971 A1 * | 3/2013 | ......... H01L 27/3246 |

OTHER PUBLICATIONS

European Patent Office, Extended European Search Report and Opinion, EP Patent Application No. 22204602.1, May 15, 2023, ten pages.

* cited by examiner

*Primary Examiner* — William C Trapanese
(74) *Attorney, Agent, or Firm* — Fenwick & West LLP

(57) ABSTRACT

A light emitting display device having enhanced display quality by reducing reflection of external light is disclosed. An light emitting display device according to the present disclosure comprises: a driving layer on a substrate; a planarization layer on the driving layer; a plurality of anode electrodes on the planarization layer; a bank between the anode electrodes to define an emission area; an emission layer on the bank and the anode electrode; a cathode electrode on the emission layer; and a reflectance control layer at any one of an upper portion of the bank and an upper portion of the planarization layer.

18 Claims, 9 Drawing Sheets

ⓐ + ⓑ = ⓒ

ⓐ + ⓑ' = ⓒ'

LIGHT EMITTING DISPLAY DEVICE

CROSS-REFERENCE TO RELATED APPLICATIONS

This application claims the benefit of Republic of Korea Patent Application No. 10-2021-0192861 filed on Dec. 30, 2021, and Republic of Korea Patent Application No. 10-2022-0091701 filed on Jul. 25, 2022, each of which are hereby incorporated by reference in its entirety.

BACKGROUND

Field of Technology

The present disclosure relates to a light emitting display device having enhanced display quality by reducing external light from being reflected.

Discussion of the Related Art

In the light emitting display device, an external light (or ambient light) reflection suppressing structure can be accomplished by disposing a polarization element in front of the display panel. The polarizing element for suppressing external light reflection may have a problem of reducing the amount of light provided by the display device, and it is very expensive element. Therefore, there is a demand for the development of a structure for a light emitting display device capable of suppressing external light reflection without adding a polarizing element.

SUMMARY

The purpose of the present disclosure, as for solving the problems described above, is to provide a light emitting display device having excellent still or video image quality by suppressing the external light reflection.

In an embodiment, the purpose of the present disclosure is to provide a light emitting display device in which external light reflection is suppressed without polarizing element.

In an embodiment, the purpose of the present disclosure is to provide a light emitting display device capable of reducing or preventing display quality deterioration due to external light reflection by cathode electrode.

In an embodiment, the purpose of the present disclosure is to provide a light emitting display device capable of reducing or preventing deterioration of display quality due to parasitic external light reflection due to thickness non-uniformity in the cathode electrode having a low reflection structure.

In order to accomplish the above mentioned purposes of the present disclosure, in one embodiment a light emitting display device comprises: a driving layer on a substrate, the driving layer including a transistor; a planarization layer on the driving layer; a plurality of anode electrodes on the planarization layer; a bank between the plurality of anode electrodes, the bank defining an emission area; an emission layer on the bank and the plurality of anode electrodes; a cathode electrode on the emission layer and the bank; and a reflectance control layer at any one of the bank or the planarization layer, the reflectance control layer having a refraction index that is different from a refraction index of the bank and a refraction index of the planarization layer.

In one embodiment, a light emitting display device comprises: a substrate; a planarization layer on the substrate; a plurality of anode electrodes on the planarization layer; a bank between the plurality of anodes to define emission areas of the light emitting device, the bank including a first bank portion at a first region of the substrate and a second bank portion at a second region of the substrate that is different from the first region of the substrate; an emission layer on the bank and the plurality of anode electrodes; a cathode electrode on the bank and the emission layer; and a reflectance control layer on the bank such that the reflectance control layer is between the emission layer and the planarization layer, the reflectance control layer having an index of refraction that is different from the bank, wherein a first thickness of a first portion of the reflectance control layer that is on the first bank portion in the first region is different from a second thickness of a second portion of the reflectance control layer that is on the second bank portion in the second region.

The electroluminescent display according to the present disclosure may include a cathode electrode having a low-reflection structure for the bottom emission type, so there is no deterioration in image quality due to external light reflection. Further, a low-reflection structure is applied to the lines, image quality deterioration due to reflection of external light from the lines does not occur. In addition, in manufacturing a cathode electrode having a low reflection structure, the present disclosure may provide a light emitting display device having a compensating low-reflection structure capable of eliminating the parasitic external light reflection caused by failing to secure thickness uniformity of the cathode electrode. A light emitting display device according to the present disclosure may have a structure for suppressing the external light reflection, so may provide excellent video quality.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
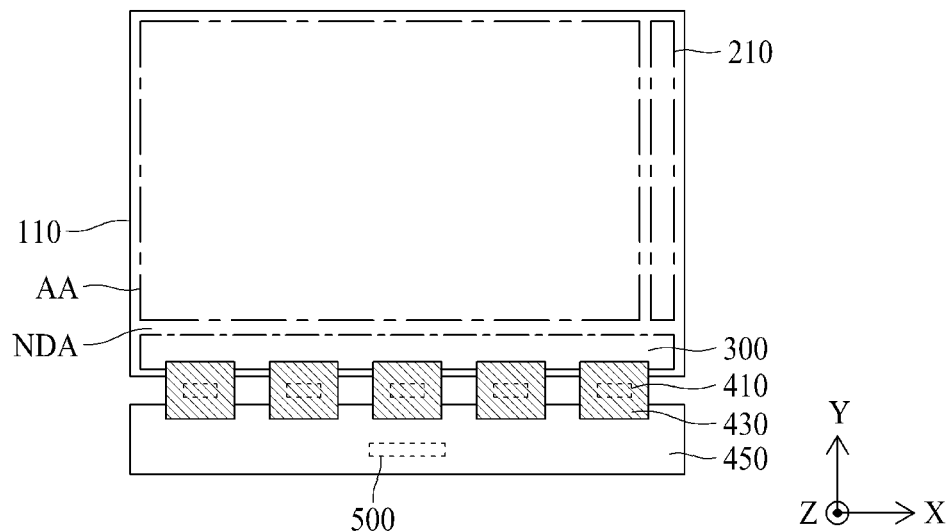
FIG. 1 is a plane view illustrating a schematic structure of a light emitting display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween. Also, if a first element is described as positioned "on" a second element, it does not necessarily mean that the first element is positioned above the second element in the figure. The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) may be used. These terms are used merely to distinguish one element from another, and not to define a particular nature, order, sequence, or number of the elements. Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to the present disclosure will be described in detail with reference to the attached drawings. Wherever possible, the same reference numbers will be used throughout the drawings to refer to the same or like parts. Since a scale of each of elements shown in the accompanying drawings may be different from an actual scale for convenience of description, the present disclosure is not limited to the scale shown in the drawings.

Hereinafter, referring to the attached figures, the present disclosure will be explained. FIG. 1 is a plane view illustrating a schematic structure of a light emitting display device according to one embodiment of the present disclosure. In FIG. 1, X-axis refers to the direction parallel to the scan line, Y-axis refers to the direction of the data line, and Z-axis refers to the height direction of the display device.

Referring to FIG. 1, the light emitting display device comprises a substrate 110, a gate (or scan) driver 210, a pad portion 300, a source driving IC (Integrated Circuit) 410, a flexible circuit film 430, a circuit board 450, and a timing controller 500.

The substrate 110 may include an electrical insulating material or a flexible material. The substrate 110 may be made of a glass, a metal or a plastic, but it is not limited thereto. When the light emitting display device is a flexible display, the substrate 110 may be made of the flexible material such as plastic. For example, the substrate 110 may include a transparent polyimide material.

The substrate 110 may include a display area AA and a non-display area NDA. The display area AA, which is an area for displaying the video images, may be defined as the majority middle area of the substrate 110, but it is not limited thereto. In the display area AA, a plurality of scan lines (or gate lines), a plurality of data lines and a plurality of pixels may be formed or disposed. Each of pixels may include a plurality of sub pixels. Each of sub pixels includes the scan line and the data line, respectively.

The non-display area NDA, which is an area that does not display the video images, may be disposed adjacent to the display area AA. For example, the non-display area NDA may be defined at the circumference areas of the substrate 110 surrounding all or some of the display area AA. In the non-display area NDA, the gate driver 210 and the pad portion 300 may be formed or disposed.

The gate driver 210 may supply the scan (or gate) signals to the scan lines according to the gate control signal input through the pad portion 300 from the timing controller 500. The gate driver 210 may be formed at the non-display area NDA at any one outside of the display area AA on the substrate 110, as a GIP (Gate driver In Panel) type. GIP type means that the gate driver 210 is directly formed on the substrate 110. For example, the gate driver 210 may be configured as a shift resistor, and the GIP type refers to a structure in which transistors for the shift resistor of the gate driver 210 are directly formed on the substrate 110.

The pad portion 300 may be disposed in the non-display area NDA of one edge of the display area AA of the substrate 110. The pad portion 300 may include data pads connected to each of the data lines, and gate pads connected to the gate driver 210.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible circuit film 430 as a COF (chip on film) or COP (chip on plastic) type.

The flexible circuit film 430 may include a plurality of first link lines connecting the pad portion 300 to the source driving IC 410, and a plurality of second link lines connecting the pad portion 300 to the circuit board 450. The flexible circuit film 430 may be attached on the pad portion 300 using an anisotropic conducting film, so that the pad portion 300 may be connected to the first link lines of the flexible circuit film 430.

The circuit board 450 may be attached to the flexible circuit film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 210 and a source control signal for controlling the source driving IC 410, based on the timing signal. The timing controller 500 may supply the gate control signal to the gate driver 210 and supply the source control signal to the source driving IC 410. Depending on the product types, the timing controller 500 may be formed as one chip with the source driving IC 410 and mounted on the substrate 110.

First Embodiment

Figure 2:
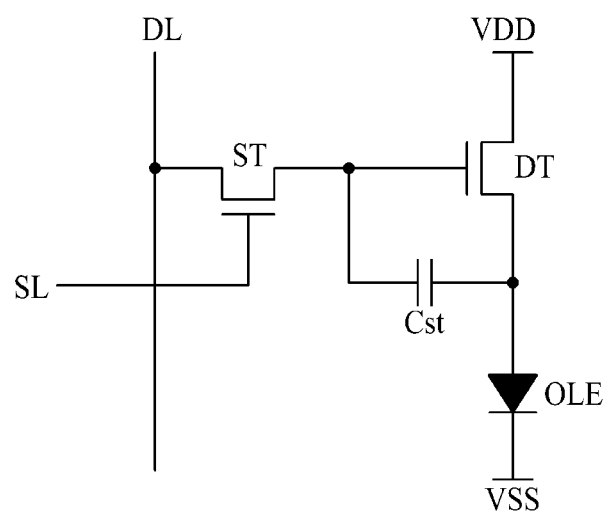
FIG. 2 is a circuit diagram illustrating a structure of one pixel included in the light emitting display device according to one embodiment of the present disclosure.
Figure 3:
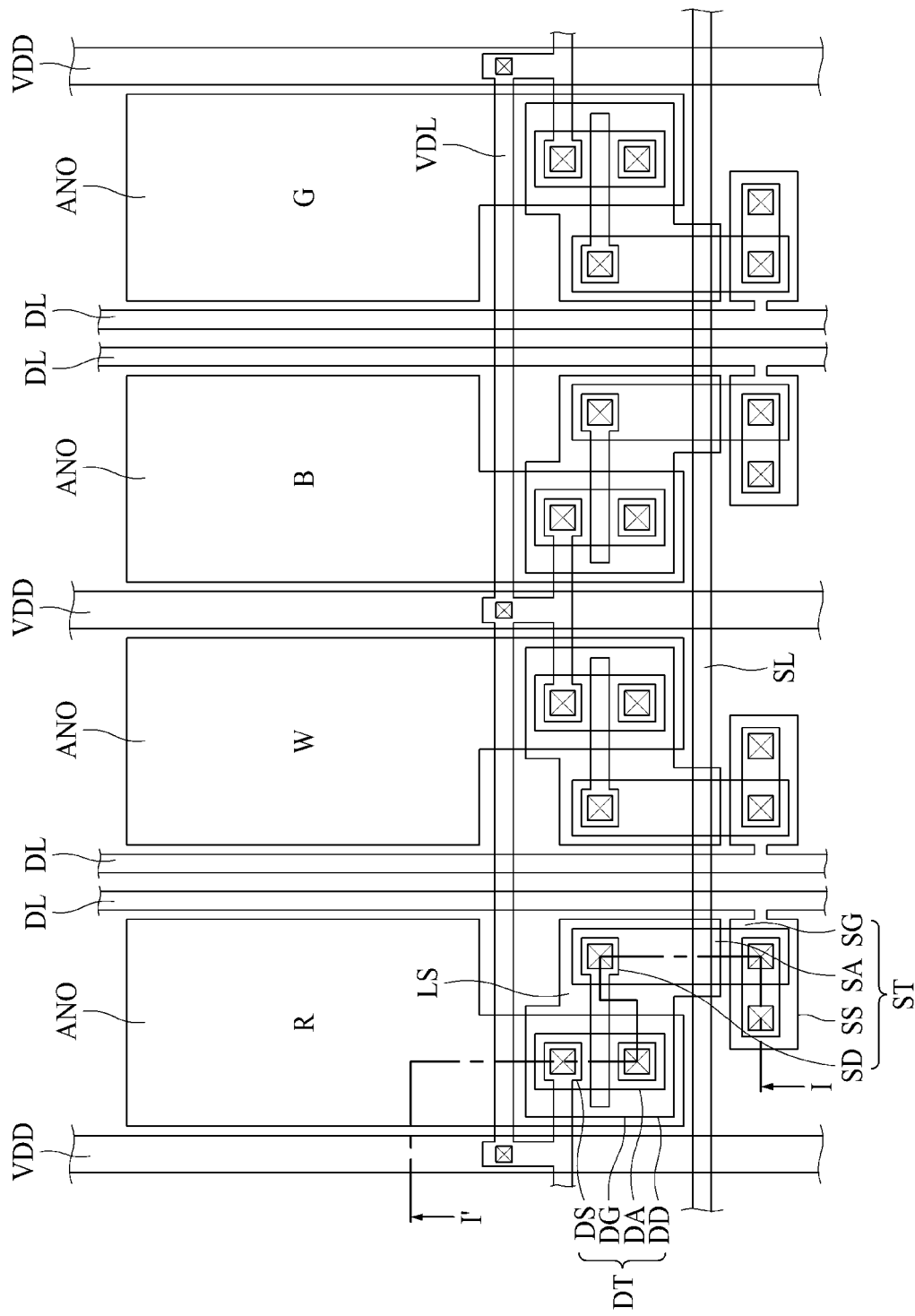
FIG. 3 is a plan view illustrating a structure of the pixels disposed in the light emitting display device according to one embodiment of the present disclosure.
Figure 4:
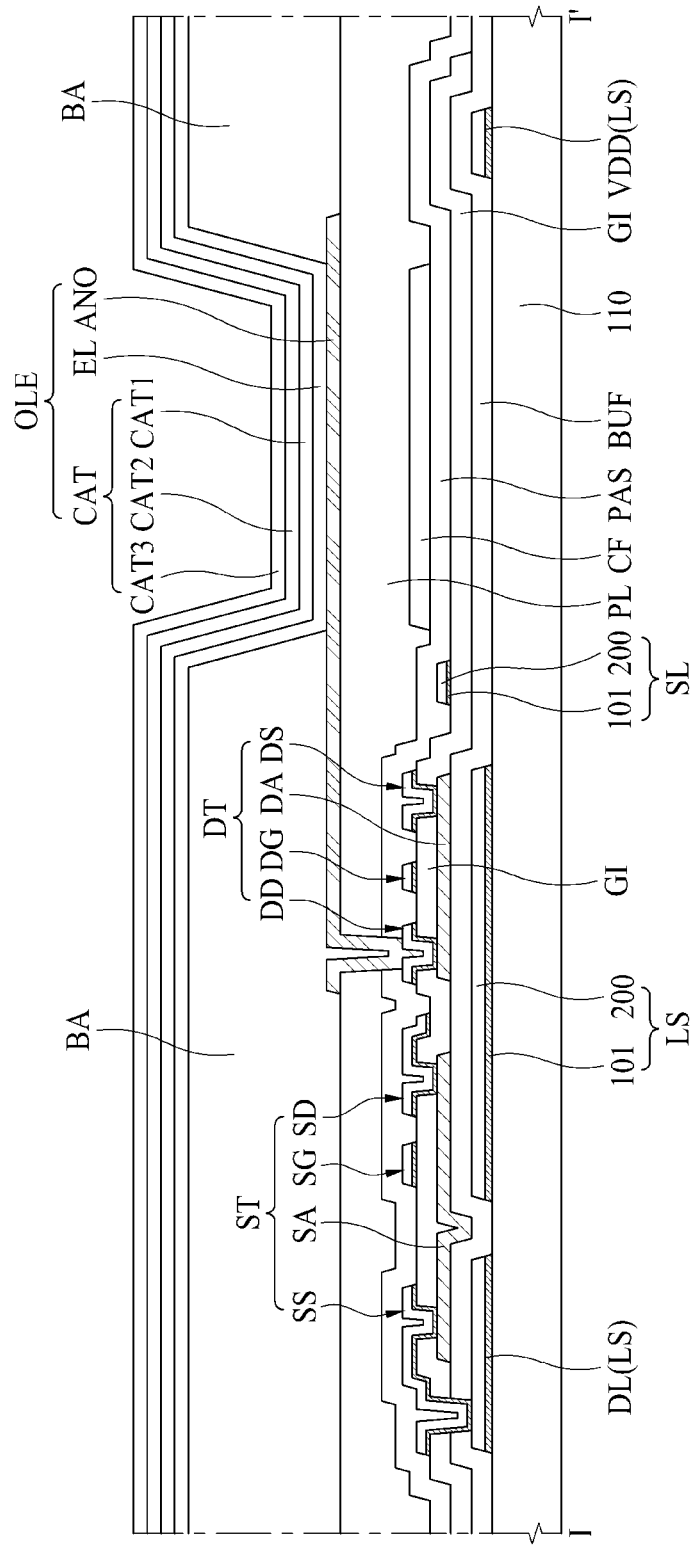
FIG. 4 is a cross-sectional view along cutting line I-I' in FIG. 3 that illustrates the low reflecting structure of the light emitting display device according to a first embodiment of the present disclosure.

Hereinafter, referring to FIGS. 2 to 4, a first embodiment of the present disclosure will be explained. FIG. 2 is a circuit diagram illustrating a structure of one pixel according to one embodiment the present disclosure. FIG. 3 is a plan view illustrating a structure of the pixels according to one embodiment the present disclosure. FIG. 4 is a cross-sectional view along cutting line IT in FIG. 3 that illustrates the low reflecting structure of the electroluminescent display according to a first embodiment of the present disclosure.

Referring to FIGS. 2 to 4, one pixel of the light emitting display may be defined by a scan line SL, a data line DL and a driving current line VDD. One pixel of the light emitting display may include a switching thin film transistor ST, a driving thin film transistor DT, a light emitting diode OLE and a storage capacitance Cst. The driving current line VDD may be supplied with a high-level voltage for driving the light emitting diode OLE.

A switching thin film transistor ST and a driving thin film transistor DT may be formed on a substrate 110. For example, the switching thin film transistor ST may be disposed at the portion where the scan line SL and the data line DL is crossing. The switching thin film transistor ST may include a gate electrode SG, a source electrode SS and a drain electrode SD. The gate electrode SG may be connected to the scan line SL. The source electrode SS may be connected to the data line DL and the drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light emitting diode OLE of the pixel selected by the switching thin film transistor ST. The driving thin film transistor DT may include a gate electrode DG, a source electrode DS and a drain electrode DD. The gate electrode DG of the driving thin film transistor DT may be connected to the drain electrode SD of the switching thin film transistor ST. For example, the gate electrode DG of the driving thin film transistor DT may be connected to the drain electrode SD of the switching thin film transistor ST via the drain contact hole penetrating the gate insulating layer GI. The source electrode DS of the driving thin film transistor DT may be connected to the driving current line VDD, and the drain electrode DD of the driving thin film transistor DT may be connected to an anode electrode ANO of the light emitting diode OLE. A storage capacitance Cst may be disposed between the gate electrode DG of the driving thin film transistor DT and the anode electrode ANO of the light emitting diode OLE.

The driving thin film transistor DT may be disposed between the driving current line VDD and the light emitting diode OLE. The driving thin film transistor DT may control or adjust the amount of electric current flowing to the light emitting diode OLE from the driving current line VDD according to the voltage differences between the gate electrode DG and the source electrode DS.

The light emitting diode OLE may include an anode electrode ANO, a light emitting layer EL and a cathode electrode CAT. The light emitting diode OLE may emit the light according to the amount of the electric current controlled by the driving thin film transistor DT. In other words, the light emitting diode OLE may display an image by emitting light according to electric currents adjusted by the driving thin film transistor DT. The anode electrode ANO of the light emitting diode OLE may be connected to the drain electrode DD of the driving thin film transistor DT, and the cathode electrode CAT may be connected to a low-level voltage line VSS where a low-level potential voltage is supplied. That is, the light emitting diode OLE may be driven by the electric currents flown by the driving thin film transistor DT from the driving current line VDD to the low-level voltage line VSS.

Referring to FIG. 4, the cross-sectional structure of a light emitting display device according to the first embodiment of the present disclosure will be explained. The light shielding layer LS may be disposed on the substrate 110. The light shielding layer LS may include a light shielding region and a signal line region. The signal line region of the light shielding layer LS may include the data line DL and the driving current line VDD. Further, the light shielding region of the light shielding layer LS may be disposed as being apart from the data line DL and the driving current line VDD with a predetermined distance, and having an island shape overlapping with the switching semiconductor layer SA of the switching thin film transistor ST and the driving semiconductor layer DA of the driving thin film transistor DT. The light shielding layer LS is not used for any conductive line and may block the external light from intruding into the semiconductor layer SA and DA to reduce deterioration of the characteristics of the semiconductor layers SA and DA. In one embodiment, the light shielding layer LS may be disposed as being overlapped with the channel regions in the semiconductor layers SA and DA which are overlapped with the gate electrodes SG and DG, respectively. In addition, the light shielding layer LS may be disposed as being over-lapped with some portions of the source-drain electrodes SS, SD, DS and DD respectively contacting to the semiconductor layers SA and DA.

A buffer layer BUF is disposed on the light shielding layer LS and covers the whole surface of the substrate 110. On the buffer layer BUF, the semiconductor layer SA of the switching thin film transistor ST and the semiconductor layer DA of the driving thin film transistor DT are formed. In one embodiment, the channel areas in the semiconductor layers SA and DA are disposed as overlapping with the light shielding layer LS.

A gate insulating layer GI may be disposed on the surface of the substrate 110 having the semiconductor layers SA and DA. On the gate insulating layer GI, a gate electrode SG may be formed as being overlapped with the semiconductor layer SA of the switching thin film transistor ST, and a gate electrode DG may be formed as being overlapped with the semiconductor layer DA of the driving thin film transistor DT. At the both sides of the gate electrode SG of the switching thin film transistor ST, a source electrode SS contacting with a first side of the semiconductor layer SA and being apart from the gate electrode SG may be formed, and a drain electrode SD of the switching thin film transistor ST contacting with a second side of the semiconductor layer SA and being apart from the gate electrode SG may be formed. In addition, at the both sides of the gate electrode DG of the driving thin film transistor DT, a source electrode DS contacting with a first side of the semiconductor layer DA and being apart from the gate electrode DG may be formed, and a drain electrode DD of the driving thin film transistor DT contacting with a second side of the semiconductor layer DA and being apart from the gate electrode DG may be formed.

The gate electrodes SG and DG and the source-drain electrodes SS, SD, DS and DD are formed at the same layer, but they are separated each other. The source electrode SS of the switching thin film transistor ST may be connected to the data line DL formed as a part of the signal line region of the light shielding layer LS via a contact hole penetrating the gate insulating layer GI and the buffer layer BUF. In addition, the source electrode DS of the driving thin film transistor DT may be connected to the driving current line VDD formed as another part of the signal line region of the light shielding layer LS via another contact hole penetrating the gate insulating layer GI and the buffer layer BUF.

On the substrate 110 having the thin film transistors ST and DT, a passivation layer PAS may be deposited. The passivation layer PAS may be formed of inorganic layer such as silicon oxide or silicon nitride. A color filter CF may be formed on the passivation layer PAS. The color filter CF may be an element for representing color allocated at each pixel. For an example, one color filter CF may have a size and a shape corresponding to the size and the shape of one pixel. For another example, one color filter CF may have a size slightly larger than that of the light emitting diode OLE which will be formed later and may be disposed to overlap the light emitting diode OLE.

A planarization layer PL may be deposited on the color filter CF. The planarization layer PL may be a thin film for flattening or evening the non-uniform surface of the substrate 110 on which the thin film transistors ST and DT are formed. To do so, the planarization layer PL may be made of the organic materials. The passivation layer PAS and the planarization layer PL may have a pixel contact hole for exposing some portions of the drain electrode DD of the driving thin film transistor DT.

On the surface of the planarization layer PL, an anode electrode ANO may be formed. The anode electrode ANO may be connected to the drain electrode DD of the driving thin film transistor DT via the pixel contact hole. The anode electrode ANO may have different elements according to the emission condition of the light emitting diode OLE. For the bottom emission type in which the emitted light may be provided to the substrate 110, it is preferable that the anode electrode ANO may be made of a transparent conductive material. For the top emission type in which the emitted light may be provided to the direction opposition the substrate 110, it is preferable that the anode electrode ANO may include a metal material with excellent reflection ratio.

The bank BA is formed to cover the edge area of the anode electrode ANO. The central region of the anode electrode ANO in which the bank BA is not stacked may be defined as an emission area.

An emission layer EL may be deposited on the anode electrode ANO and the bank BA. The emission layer EL may be deposited over the whole surface of the display area AA on the substrate 110 so as to cover the anode electrodes ANO and banks BA. For an example, the emission layer EL may include two or more stacked emission portions for emitting white light. In detail, the emission layer EL may include a first emission layer providing a first color of light and a second emission layer providing a second color of light, for emitting the white light by combining the first color of light and the second color of light.

In another example, the emission layer EL may include at least any one of blue-light emission layer, green-light emission layer and red-light emission layer as corresponding to the color allocated to the pixel. In addition, the light emitting diode OLE may further include at least one functional layer for enhancing the light emitting efficiency and/or the service life time of the emission layer EL.

The cathode electrode CAT may be disposed on the emission layer EL. The cathode electrode CAT may be stacked on the emission layer EL as being in surface therewith. The cathode electrode CAT is formed over the entire substrate 110 to be commonly connected to the emission layer EL deposited in all pixels. In the case of a large-area display device such as a television set, the cathode electrode CAT is formed as one layer over a large area, and maintains a uniform low voltage over the entire area of the cathode electrode CAT. Therefore, in the case of a large-area display device, the cathode electrode CAT is an opaque metal material. Therefore, in the case of a large-area display device, the large-area display device has a bottom emission type structure.

In the case of the bottom emission type, the anode electrode ANO may include a transparent conductive material. For example, the anode electrode ANO may include a metal oxide material such as indium-zinc-oxide (or IZO) or indium-tin-oxide (or ITO). In addition, for the case of the bottom emission type, the cathode electrode CAT may include metal material having excellent light reflection ratio. For example, the cathode electrode CAT may include at least any one of silver (Ag), aluminum (Al), molybdenum (Mo), gold (Au), magnesium (Mg), calcium (Ca), titanium (Ti), copper (Cu) or barium (Ba).

The present disclosure provides a low-reflection structure for reducing the external light from being reflected by the metal materials of the display device. For an example, the present disclosure provides a structure for reducing the external light from being reflected by the cathode electrode CAT formed over the whole surface area of the substrate 110. Further, the present disclosure provides a structure for reducing the external light from being reflected by the light shielding layer LS that is the closest layer to the substrate 110. In addition, present disclosure provides a structure for reducing the external light from being reflected by some portions of the gate line SL exposed to the bottom surface of the substrate 110 because the exposed portions of the gate line SL is not overlapped with the light shielding layer LS.

Figure 5:
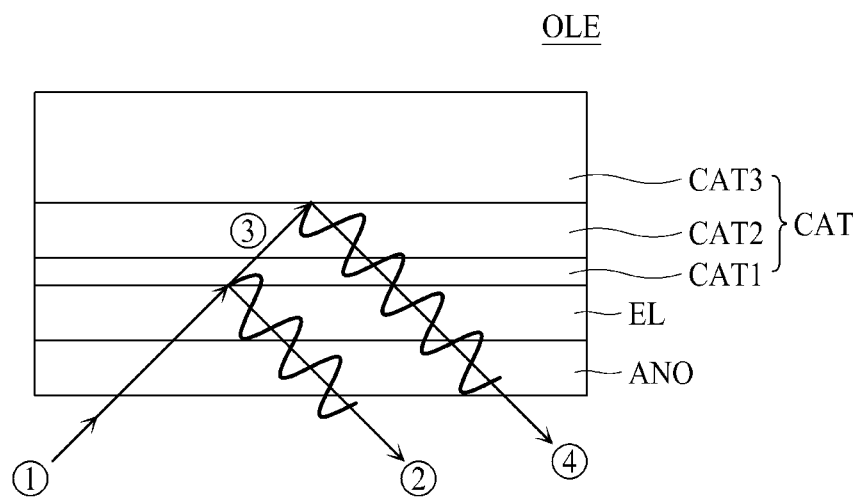
FIG. 5 is an enlarged cross-sectional view explaining a cathode electrode having a low-reflection structure in a light emitting display device according to the first embodiment of the present disclosure.

Referring to FIG. 5, in the first embodiment of the present disclosure, the structure of the cathode electrode CAT for suppressing the reflection of the external light will be explained. FIG. 5 is an enlarged cross-sectional view explaining a cathode electrode having a low-reflection structure in a light emitting display device according to the first embodiment of the present disclosure.

In a bottom emission type light emitting display device according to the present disclosure, the cathode electrode CAT may include a plurality of cathode layers (e.g., three cathode layers). For example, the cathode electrode CAT may include a first cathode layer CAT1, a second cathode layer CAT2, and a third cathode layer CATS sequentially stacked on the emission layer EL. The first cathode layer CAT1 may be firstly stacked on the emission layer EL so as to be in direct surface contact with the emission layer EL. The first cathode layer CAT1 may made of a metal material having relatively low surface resistance. For example, the first cathode layer CAT1 may include any one of aluminum (Al), silver (Ag), molybdenum (Mo), gold (Au), magnesium (Mg), calcium (Ca), or barium (Ba). Considering the manufacturing process and cost, a case in which the first cathode layer CAT1 may be formed of aluminum will be explained as the most preferred example.

In the case that the first cathode layer CAT1 is made of aluminum, the first cathode layer CAT1 may be formed a thickness of 100 Å to 200 Å in one embodiment. The metallic materials such as aluminum are opaque and relatively highly reflective. However, as aluminum is formed very thin, light may pass through the aluminum thin layer. For example, for thin aluminum layer having a thickness of 200 Å or less, some portions (40%~50%) of incident light may be reflected by the aluminum layer, and the remaining portions (50%~60%) may transmit the aluminum layer.

The second cathode layer CAT2 may include conductive resin materials. The conductive resin materials may include a domain material made of a resin material with high electron mobility and a dopant for lowering the barrier energy of the domain material. The resin materials having high electron mobility may include any one selected from Alq3, TmPyPB, Bphen, TAZ and TPB. Alq3 may be an abbreviation of 'Tris(8-hydroxyquinoline) Aluminum', and be a complex having a chemical formula of $Al(C_9H_6NO)_3$. TmPyPB may be an organic material that is an abbreviation of '1,3,5-tri(m-pyrid-3-yl-phenyl) benzene'. Bphen may be an organic material that is an abbreviation of 'Bathophenanthroline'. TAZ may be organic material that is an abbreviation of '1,2,3-triazole'. TPB may be organic material that is an abbreviation for triphenyl bismuth. Since these organic materials have high electron mobility, they may be used in a light emitting element.

The dopant materials may include an alkali-based doping material. For example, the dopant materials may include at least any one of lithium (Li), cesium (Cs), cesium oxide ($Cs_2O_3$), cesium nitride ($CsN_3$), rubidium (Rb) and rubidium oxide ($Rb_2O$). For another example, the dopant materials may include fullerene having high electron mobility. Fullerene may be a generic term for molecules in which carbon atoms are arranged in a sphere, ellipsoid or cylinder shape. For example, the dopant materials may include Buckminster-fullerene (C60) in which 60 carbon atoms are mainly bonded in the shape of a soccer ball. In addition, the dopant materials may include higher fullerenes such as C70, C76, C78, C82, C90, C94 and C96.

The second cathode layer CAT2 may have the same materials as the electron transporting layer or electron injecting layer included into the emission layer EL. However, unlike the electron transporting layer or the electron injecting layer, the second cathode layer CAT2 may have higher electron mobility than the electron transporting layer or the electron injecting layer. For example, the electron transporting layer or the electron injecting layer may have the electron mobility of $5.0\times10^{-4}$ (S/m) to $9.0\times10^{-1}$ (S/m), whereas the second cathode layer CAT2 may have an electron mobility of $1.0\times10^{-3}$ (S/m) to $9.0\times10^{+1}$ (S/m). For this, the conductive resin materials included into the second cathode layer CAT2 may have a dopant content higher than that of the electron transporting layer or the electron injecting layer.

For example, the electron transporting layer or the electron injecting layer has a dopant doping concentration of 2% to 10%, whereas the second cathode layer CAT2 may be a conductive resin material having a dopant doping concentration of 10% to 30% in one embodiment. The domain material itself, in which the dopant has a doping concentration of 0%, may have an electrical conductivity of $1.0\times10^{-4}$ (S/m) to $5.0\times10^{-3}$ (S/m). By doping 10% to 30% of dopant into the domain material, the second cathode layer CAT2 may have improved electrical conductivity of $1.0\times10^{-3}$ (S/m) to $9.0\times10^{+1}$ (S/m) to be used as a cathode electrode.

In one case, the second cathode layer CAT2 may have the same conductivity as the electron functional layer (electron transporting layer and/or electron injecting layer) of the emission layer EL. In this case, the sheet resistance of the cathode electrode CAT may be maintained at a sufficiently low value due to the first cathode layer CAT1 made of aluminum.

The third cathode layer CAT3 may be made of the same material as the first cathode layer CAT1. In one embodiment, the third cathode layer CAT3 may have a sufficient thickness so that the sheet resistance of the cathode electrode CAT may be maintained at a constant value regardless of the position of the substrate SUB while not transpassing the light but reflecting all of the light. For example, the third cathode layer CAT3 may be a metal material having a low sheet resistance to have a relatively thicker thickness than the first and second cathode layers CAT1 and CAT2 in order to lower the overall sheet resistance of the cathode electrode CAT. For example, the third cathode layer CAT3 may be formed of aluminum having a thickness in range of 2,000 Å to 4,000 Å.

The cathode electrode CAT having such a thickness and a stacked structure mentioned above may reduce a reflection ratio with respect to the light incident from the bottom direction of the substrate (i.e., from the outside to the first cathode layer CAT1). A portion requiring external light reflection suppression may be a display area that may mainly affect image information. Accordingly, a low reflection structure is implemented in the cathode electrode CAT that is commonly applied over the entire display area AA. Hereinafter, description will be made with reference to arrows indicating the optical path shown in FIG. 5.

Referring to the structure of the cathode electrode CAT included into light emitting diode OLE, the incident light ① from the lower outside of the cathode electrode CAT may transpass through the anode electrode ANO and the emission layer EL which are transparent. Some of the incident light ① may be reflected at the bottom (or lower) surface of the first cathode layer CAT1 and then proceed toward the substrate 110 as the first reflected light ②. Since the first cathode layer CAT1 has a thin thickness of 200 Å or less, all of the incident light ① may not be reflected. For example, 40% of the incident light ① may be reflected as the first reflected light ②, and the remaining 60% of the incident light ① may pass through the first cathode layer CAT1. The whole amount of the transmitted light ③ passing through the first cathode layer CAT1 may pass through the transparent second cathode layer CAT2. After that, the transmitted light ③ may be reflected by the third cathode layer CAT3. Since the third cathode layer CAT3 may have a thickness of 2,000 Å to 4,000 Å, whole amount of the transmitted light ③ may be reflected and proceed toward the substrate 110 as the second reflected light ④.

Here, by adjusting or changing the thickness of the second cathode layer CAT2, the phases of the first reflected light ② and the second reflected light ④ may be set to cancel each other. Accordingly, the reflected light luminance, which is the intensity of the reflected light incident from outside of the cathode electrode CAT and finally reflected to the outside of the substrate 110 may be reduced to 2% or less.

Meanwhile, among the light emitted from the emission layer EL, the amount of light emitted to the direction of the cathode electrode CAT and reflected by the cathode electrode CAT may be reduced to about 2% through the same mechanism. However, since the light emitted from the emission layer EL may be propagated in all directions, the amount of light reduced by the cathode electrode CAT may be only about 50% of the total amount of the light from the emission layer EL, and the remaining 50% may be emitted toward the substrate 110.

The light emitting display device according to the first embodiment may be the bottom emission type including cathode electrode CAT of a triple layer stacked structure. The reflection ratio of the external light may be suppressed as much as possible by the structure of the cathode electrode CAT of the triple layer stacked structure. Therefore, there is no need to dispose a polarization element on the outside of the substrate 110 to reduce the external light reflection. The polarization element has a positive effect of suppressing the external light reflection, but has a negative effect of reducing the amount of light emitted from the emission layer EL by at least 50%.

In the light emitting display device according to the first embodiment, the amount of the light emitted from the emission layer EL may be reduced by about 50% due to the cathode electrode CAT of the triple layer stack structure, but this is almost the same as the reduction in the amount of light due to the polarization element. Accordingly, the light emitting display device according to the present disclosure may reduce the external light reflection while providing the same level of luminous efficiency without using an expensive polarization element.

Figure 6:
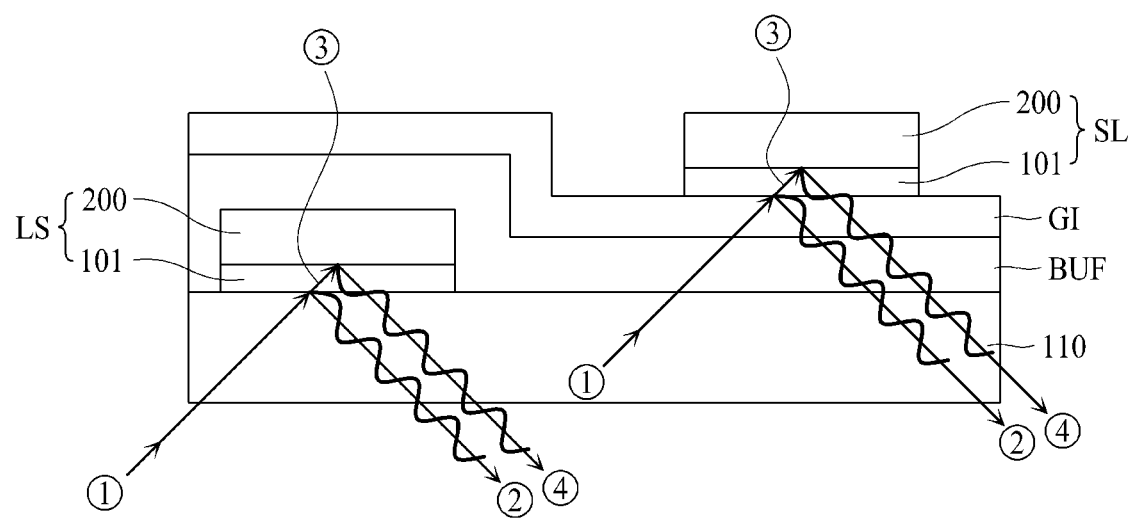
FIG. 6 is an enlarged cross-sectional view illustrating a light shielding layer and lines having a low-reflection structure in a light emitting display device according to the first embodiment of the present disclosure.

Hereinafter, referring to FIG. 6, a structure for suppressing the reflection of the external light in the light shielding layer LS and the gate line SL will be explained. FIG. 6 is an enlarged cross-sectional view illustrating a light shielding layer and a gate line having a low-reflection structure in a light emitting display device according to one embodiment of the present disclosure.

In the first embodiment, the light shielding layer LS and the gate line SL, the gate electrodes SG and DG, the source-drain electrodes SS, SD, DS and DD and the link line VDL connecting the driving drain electrode DD to the driving current line VDD may have the structure for suppressing the external light reflection. For example, the gate line SL and the light shielding layer LS including the data line DL and the driving current line VDD may have a structure in which a first metal layer 101 and a second metal layer 200 may be stacked sequentially.

The first metal layer 101 may include low reflective metal oxide material with a thickness in range of 100 Å to 500 Å. The low reflective metal oxide material may be formed any one of molybdenum-titanium-oxide (MTO), molybdenum-copper-oxide (MoCuOx) and tungsten oxide (WOx). The second metal layer 200 may include low resistance metallic materials with a thickness in range of 2,000 Å to 4,000 Å. For example, the low resistance metallic materials may include copper (Cu), aluminum (Al), silver (Ag), gold (Au) or the likes.

Here, the first metal layer 101 may be an oxide layer for matching the refractive index. Since the refractive index of the first metal layer 101, which is an oxide, may be significantly different from that of the second metal layer 200, which is a metallic material, the reflection of the external light may be suppressed by using the phase destructive interference between the light reflected from the first metal layer 101 and the light reflected from the second metal layer 200.

For example, as shown in FIG. 6, Some of the incident light ① passing through the substrate 110 from the bottom side of the light shielding layer LS and the gate line SL may be reflected by the bottom (or lower) surface of the first metal layer 101 and then proceed toward the substrate 110 as the first reflected light ②. The first metal layer 101 is an oxide material and has relatively high transparency, and may not reflect all of the incident light ① due to a difference in refractive index at the interface with the substrate 110. For example, about 40% of the incident light ① may be reflected as the first reflected light ②, other 60% off the incident light ① may pass through the first metal layer 101. The transmitted light ③ passing through the first metal layer 101 may be reflected by the opaque second metal layer 200. Since the second metal layer 200 is formed of an opaque metal material, all of the transmitted light ③ may be reflected and proceed toward the substrate 110 as the second reflected light ④.

Here, by adjusting or controlling the thickness of the first metal layer 101, the phases of the first reflected light ② and the second reflected light ④ may be set to cancel each other. When it is desired to selectively lower the reflection ratio of green light to which the human eye is most sensitive, the thickness of the first metal layer 101 may be set to corresponding to a multiple of a half wavelength of the green light. For example, when the representative wavelength of green light is 550 nm, the first metal layer 101 may be formed to have any one thicknesses of 275 Å, 550 Å, 825 Å and 1,100 Å which is a multiple of 275 nm, which is a half wavelength of green light, or any thicknesses of the integer multiple thereof. As a result, reflected light luminescence, which is the intensity of the reflected light that is incident to and reflected from the bottom outside of the light shielding layer LS and the gate line SL, may be reduced to a level of 2% or less.

The light emitting display device according to the first embodiment may suppress the reflection of the external light at the cathode electrode CAT by applying the low-reflection structure to the cathode electrode CAT including metal material and deposited over the whole area of the substrate. In addition, by applying the low reflection structure using metal oxide layer to the light shielding layer LS and the gate line SL which is not covered by the light shielding layer LS, the reflection of the external light may be suppressed.

With the bottom emission type light emitting display device with such a structure, the user may see the image in a direction from a bottom surface opposite the top surface on which a display element is disposed. When external light is incident into the bottom surface and reflected by the lines and the cathode electrode, the image information may be disturbed by the reflected light, and thus the user may not properly recognize the image information. However, since the light emitting display device according to the present disclosure has a low-reflection structure on the lines and the cathode electrode, the reflectance of external light may be reduced to about 2% or less of the incident amount of the external light, so there is no image quality deterioration caused by the reflection of external light.

In particular of a large area TV, several people may view a video image from a display in a relatively wide viewing angle range. Therefore, the range in which external light is reflected is too wide, so image information deterioration due to external light reflection may be occurred severely. However, the light emitting display device according to the present disclosure has a structure capable of suppressing external light reflection, so that normal image information may be provided to many people viewing the display from various angles without deterioration of image quality due to external light reflection.

In the case of manufacturing a large-area display as described above, it is very difficult to form the thin film layer to have the uniform thickness over the entire large area. For example, in the case of a low reflection line having an external light reflection suppression structure, as shown in FIG. 6, the second metal layer 200 is stacked on the first metal layer 101. The first metal layer 101 is a very thin film having a refractive index matching function, and it is very difficult to form the first metal layer 101 to have a constant (or uniform) thickness over a large area.

Second Embodiment

Figure 7:
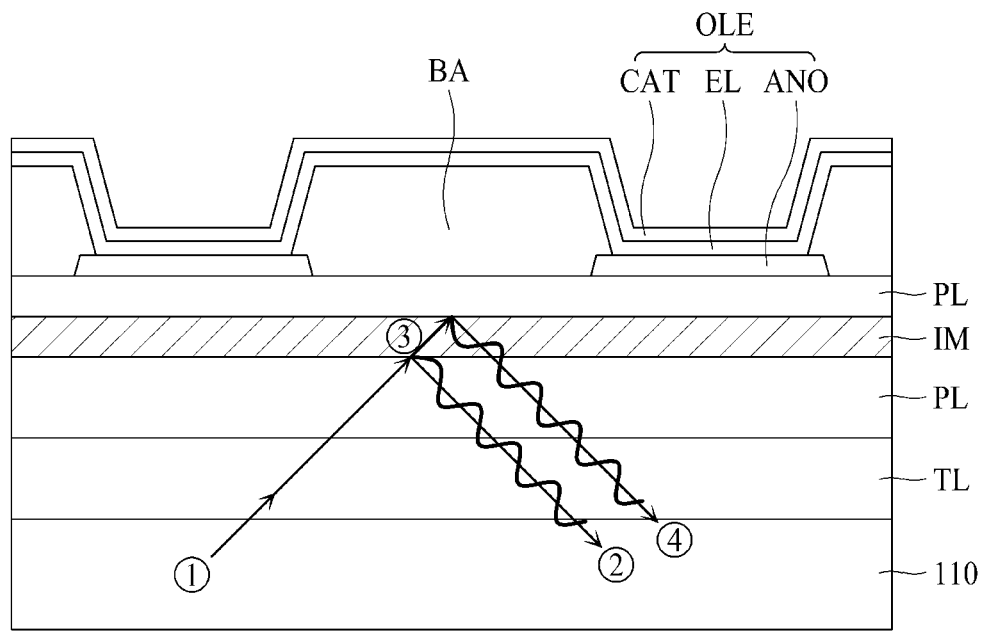
FIG. 7 is an enlarged cross-sectional view illustrating a light shielding layer and lines having a low-reflection structure in a light emitting display device according to a second embodiment of the present disclosure.

Hereinafter, referring to FIG. 7, a light emitting display device according to the second embodiment of the present disclosure will be described. FIG. 7 is an enlarged cross-sectional view illustrating a light shielding layer and lines having a low-reflection structure in a light emitting display device according to the second embodiment of the present disclosure.

Referring to FIG. 7, the light emitting display device according to the second embodiment of the present disclosure includes a driving layer TL formed on a substrate 110. The driving layer TL refers to a layer in which the gate line SL, the data line DL, the driving current line VDD, the switching thin film transistor ST and the driving thin film transistor DT described with reference to FIG. 4 are formed. A detailed description for the driving layer TL may not be duplicated since it is the same as that described with reference to FIG. 4. A planarization layer PL is deposited on the driving layer TL.

An anode electrode ANO is formed on the planarization layer PL. Between two adjacent anode electrodes ANO, a bank BA is formed to define emission areas. An emission layer EL is deposited on the anode electrode ANO and bank BA as covering entire surface of the substrate 110. A cathode electrode CAT is deposited on the emission layer EL as covering entire surface of the substrate 110.

In the second embodiment, the cathode electrode CAT may have a low-reflection structure as described in the first embodiment. However, the second embodiment may have a feature in which a low reflection structure is applied to the planarization layer PL. Accordingly, in the second embodiment, the cathode electrode CAT may have a single reflective electrode structure that does not have a low reflection structure.

For example, after forming the driving layer TL, a reflectance control layer IM may be added in the middle of the planarization layer PL in the process of forming the planarization layer PL on the entire surface of the substrate 110. Here, the reflectance control layer IM may be a refractive index control layer and include an organic material similar to that of the planarization layer PL, but is formed of a material having a refractive index different from that of the planarization layer PL. In addition, the reflectance control layer IM may be formed as close as possible to the upper portion of the planarization layer PL, because the external light reflection mainly occurs at the cathode electrode CAT.

The thickness of the reflectance control layer IM may be set to offset the reflected external light by inverting the phase of the reflected light by the optical path in consideration of the wavelength of the reflected external light. As a result, reflected light may be suppressed in a manner similar to the light path at the signal lines having the low reflection structure described in FIG. 6.

For example, as shown in FIG. 7, the incident light ① passing through the substrate 110 and entering into the lower surface of the planarization layer PL is partially reflected from the lower surface of the reflectance control layer IM as a first reflected light ②. The reflectance control layer IM does not reflect all of the incident light ① due to a difference in refractive index at the interface with the planarization layer PL. For example, only about 40% of the incident light ① is reflected as the first reflected light ②, and the remaining 60% passes through the reflectance control layer IM. The transmitting light ③ passing through the reflectance control layer IM is reflected again at the interface between the reflectance control layer IM and the planarization layer PL. At least 80% of the transmitting light ③ is reflected and travels toward the substrate 110 as the second reflected light ④. The remaining 20% may be absorbed in the reflectance control layer IM and/or the planarization layer PL. The first reflected light ② and the second reflected light ④ may have similar amounts of light.

Here, by adjusting or controlling the thickness of the reflectance control layer IM, the phases of the first reflected light ② and the second reflected light ④ may be set to cancel each other. For example, when it is desired to selectively lower the reflectance of green light to which the human eye reacts most sensitively, the thickness of the reflectance control layer IM may be set to be proportional to a multiple of a half wavelength of green light. In detail, when the representative wavelength of green light is 550 nm, the reflectance control layer IM may be formed to have a thickness of 275 Å, which is proportional to 275 nm, which is a half wavelength of green light, or an integer multiple thereof.

In the second embodiment, by applying the reflectance control layer IM, the reflection of external light by the reflective material layer stacked over the planarization layer PL may be suppressed. In addition, by applying the signal lines having the low reflection structure described with reference to FIG. 6 of the first embodiment, reflection of external light by the reflective material below the planarization layer PL may be suppressed. As a result, the light emitting display device according to the second embodiment of the present disclosure may reduce the reflected light luminance, which is the reflected light intensity of the external light on the entire substrate 110, to a level of 2%.

Third Embodiment

Figure 8:
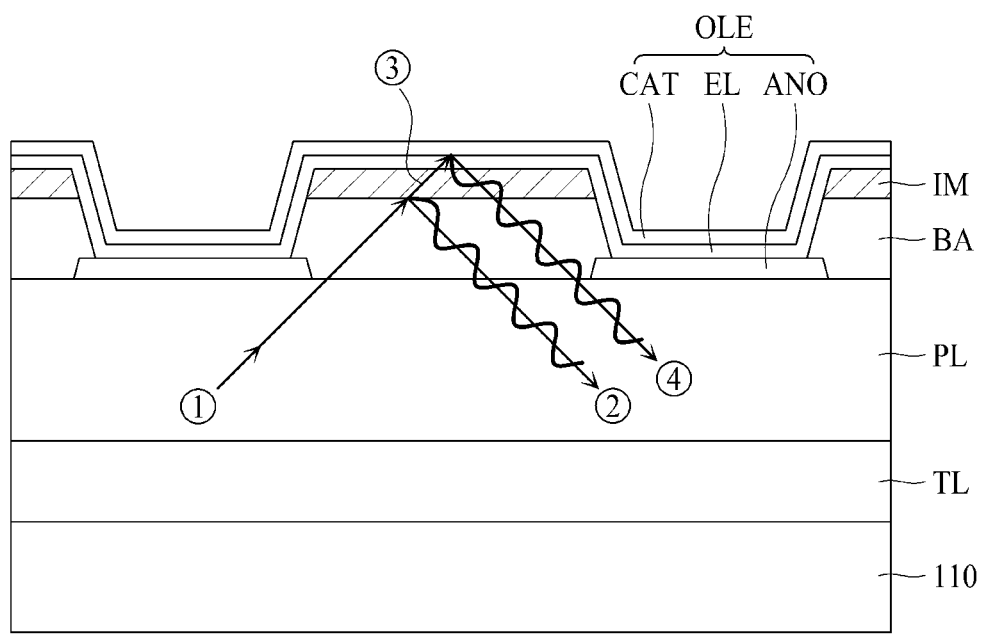
FIG. 8 is an enlarged cross-sectional view illustrating a light shielding layer and lines having a low-reflection structure in a light emitting display device according to a third embodiment of the present disclosure.

Hereinafter, referring FIG. 8, the third embodiment of the present disclosure will be explained. FIG. 8 is an enlarged cross-sectional view illustrating a light shielding layer and lines having a low-reflection structure in a light emitting display device according to the third embodiment of the present disclosure.

Referring to FIG. 8, the light emitting display device according to the third embodiment of the present disclosure includes a driving layer TL formed on a substrate 110. The driving layer TL refers to a layer in which the gate line SL, the data line DL, the driving current line VDD, the switching thin film transistor ST and the driving thin film transistor DT are formed. A planarization layer PL is deposited on the driving layer TL.

An anode electrode ANO is formed on the planarization layer PL. Between two adjacent anode electrodes ANO, a bank BA is formed to define emission areas. An emission layer EL is deposited on the anode electrode ANO and bank BA as covering entire surface of the substrate 110. A cathode electrode CAT is deposited on the emission layer EL as covering entire surface of the substrate 110.

In the third embodiment, the cathode electrode CAT may or may not have the low reflection structure described in the first embodiment. When the cathode electrode CAT has a low reflection structure, external light reflection may be more effectively suppressed. However, in the case of the bottom emission type, the proportion of the emission area is about 35%~40%. That is, the area ratio of the bank BA in the substrate 110 is 60%~75%, which occupies a large proportion. In particular, the higher the resolution, the larger the area ratio occupied by the bank BA.

Therefore, even when the external light reflectance by the cathode electrode CAT stacked on the bank BA is reduced, the external light reflectance may be sufficiently reduced by 60% or more. Accordingly, the third embodiment may have a structure capable of suppressing reflection of external light in the area of bank BA.

For example, after forming the anode electrode ANO, in the process of depositing the material of the bank BA to the entire surface of the substrate 110, a reflectance control layer IM may be added in the middle of the material of the bank BA or over the material of the bank BA. Thereafter, the layer of the bank BA including the reflectance control layer IM may be patterned to form the bank BA. The bank BA covers an edge of the anode electrode ANO, exposes a central portion of the anode electrode ANO, and defines an emission area. Here, the reflectance control layer IM may be a refractive index control layer and include an organic material similar to that of the bank BA, but is formed of a material having a refractive index different from that of the bank BA.

In addition, the reflectance control layer IM may be formed as close as possible to the upper portion of the bank BA, because that the external light reflection mainly occurs at the cathode electrode CAT. The reflectance control layer IM may be formed to be included in the bank BA, or an upper layer of the bank BA may be formed as the reflectance control layer IM. FIG. 8 shows that the case in which the upper layer of the bank BA is formed of the reflectance control layer IM.

The thickness of the reflectance control layer IM may be set to offset the reflected external light by inverting the phase of the reflected light by the optical path in consideration of the wavelength of the reflected external light.

For example, as shown in FIG. 8, the incident light ① passing through the substrate 110 and entering into the lower surface of the bank BA is partially reflected from the lower surface of the reflectance control layer IM as a first reflected light ②. The reflectance control layer IM does not reflect all of the incident light ① due to a difference in refractive index at the interface with the bank BA. For example, only about 40% of the incident light ① is reflected as the first reflected light ②, and the remaining 60% passes through the reflectance control layer IM. The transmitting light ③ passing through the reflectance control layer IM passes through the emission layer EL and then is reflected by the cathode electrode CAT. At least 80% of the transmitting light ③ is reflected and travels toward the substrate 110 as the second reflected light ④. The remaining 20% may be absorbed in the reflectance control layer IM and/or the emission layer EL. The first reflected light ② and the second reflected light ④ may have similar amounts of light.

Here, by adjusting or controlling the thickness of the reflectance control layer IM, the phases of the first reflected light ② and the second reflected light ④ may be set to cancel each other. For example, when it is desired to selectively lower the reflectance of green light to which the human eye reacts most sensitively, the thickness of the reflectance control layer IM may be set to be proportional to a multiple of a half wavelength of green light. In detail, when the representative wavelength of green light is 550 nm, the reflectance control layer IM may be formed to have a thickness of 275 Å, which is proportional to 275 nm, which is a half wavelength of green light, or an integer multiple thereof.

In the second embodiment, by applying the reflectance control layer IM, the reflection of external light by the reflective material layer stacked over the planarization layer PL may be suppressed. In addition, by applying the signal lines having the low reflection structure described with reference to FIG. 6 of the first embodiment, reflection of external light by the reflective material below the planarization layer PL may be suppressed. In the third embodiment, external light reflection by the cathode electrode CAT exposed in the emission area (i.e., there is no bank BA) is not suppressed. However, the area ratio of the area in which the bank BA is not formed is 40% or less compared to the entire substrate 110, so external light reflection may be significantly suppressed in a display used in an environment where strong external light, such as sunlight, does not exist.

Fourth Embodiment

The cathode electrode having external light reflection suppression structure may include a first cathode layer CAT1, a second cathode layer CAT2 and a third cathode layer CAT3, as shown in FIG. 5. In this structure, since the third cathode layer CAT3 has sufficient thickness to reflect all amount of light incident, it may be deposited with a uniform thickness over a large area. However, since the first cathode layer CAT1 should have the half transparency property (e.g., half of incident light is transmitted and half of incident light is reflected), it has a very thin thickness of 100 Å ~200 Å. It may be very difficult to form the very thin first cathode layer CAT1 with a uniform thickness over a very large area of 40 inches or more. Accordingly, the amount of external light reflection that is phase cancelled is reduced, so that the external light reflection becomes larger than the desired target value.

Hereinafter, the fourth embodiment provides a structure capable of effectively suppressing external light reflection by compensating for a problem that is occurred by the irregular thickness of the first cathode layer, when the cathode electrode having an external light reflection structure according to the first embodiment is applied to a large area light emitting display device. Here, the term of 'parasitic external light reflection' refers to the external light reflection caused by insufficient phase cancellation due to thickness non-uniformity of the first cathode layer CAT1. It may be called as 'residual external light reflection' or 'non-uniform external light reflection'.

Referring to the process for forming a display panel of a large-area display that may be applied to a large sized TV, a cathode layer may be deposited while a substrate is transferred in predetermined direction. Under this condition, a thickness variation occurring when a very thin film is deposited may have the same profile for each display panel, due to process environmental conditions.

Figure 9:
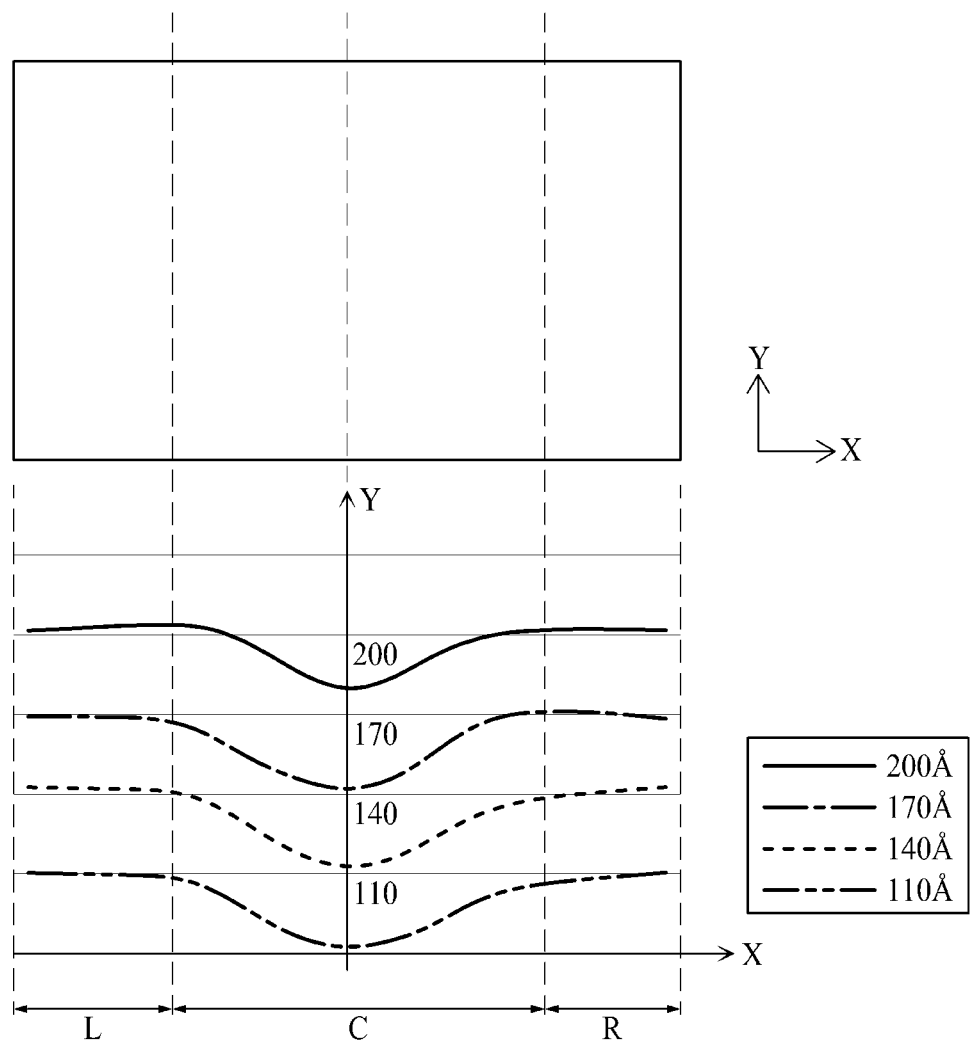
FIG. 9 is a plan view illustrating a thickness change of a thin metal film deposited for each region when a thin metal film is deposited on a horizontally long rectangular display panel according to one embodiment of the present disclosure.

As shown in FIG. 9, for the case of rectangular shaped display panel, the deposited thin film may be deposited thinner in both side regions L and R than in the central region C. FIG. 9 is a diagram illustrating a thickness variations of a metal thin film deposited for each region when a metal thin film is deposited on a rectangular display panel long in the horizontal direction (X direction). For example, when the aluminum metal layer is to be deposited to have a thickness of 200 Å, it may be actually deposited to a thickness of 180 Å in the central region C of the substrate 110, and a thickness of 200 Å in both edge regions that is the right-side region R and the left-side region L. For another example, when the aluminum metal layer is to be deposited to a thickness of 170 Å, the aluminum metal layer may be deposited to a thickness of 140 Å in the central region C of the substrate 110, and may be deposited to a thickness of 170 Å in both edge regions L and R. For still another example, with the aluminum metal layer is to be deposited to a thickness of 140 Å, it may be deposited to a thickness of 110 Å in the central region C of the substrate 110 and may be deposited to a thickness of 140 Å in both edge regions L and R.

Figure 10:
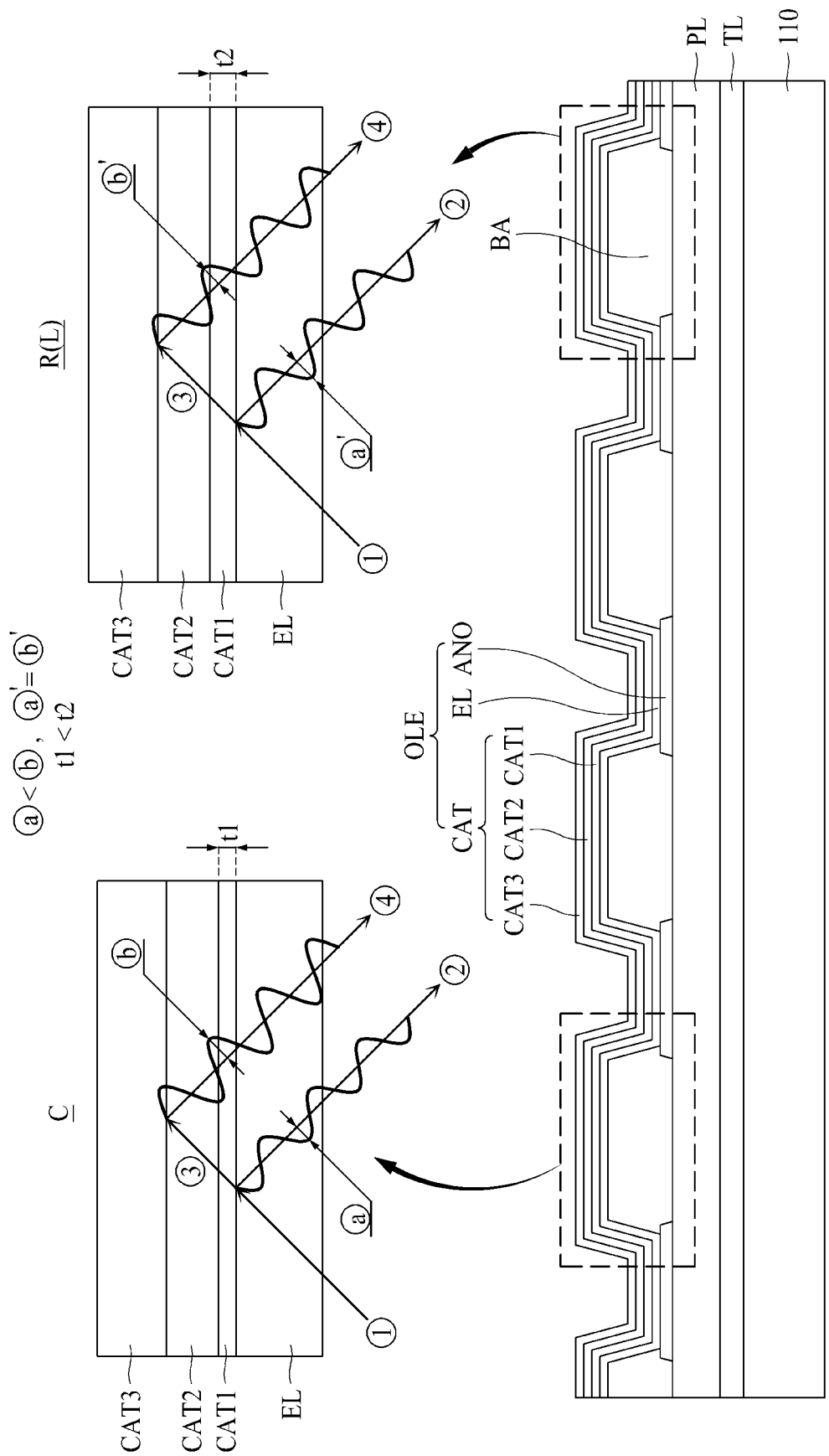
FIG. 10 is a cross-sectional view that illustrates an external light reflection mechanism when a first cathode layer having a non-uniform thickness is formed on a substrate on which an emission layer is deposited according to one embodiment of the present disclosure.

Hereinafter, referring to FIG. 10, a situation in which the thickness of the first cathode layer CAT1 is not deposited uniformly will be described. FIG. 10 is a cross-sectional view, for illustrating an external light reflection mechanism when a first cathode layer having a non-uniform thickness is formed on a substrate on which an emission layer is deposited.

Referring to FIG. 10, a driving layer TL is formed on the large-area substrate 110 having a diagonal length of 40 inches or more. A planarization layer PL is deposited on the driving layer TL to cover the substrate 110. A plurality of anode electrodes ANO is arrayed with a predetermined distance on the planarization layer PL. A plurality of banks BA are disposed on the anode electrode ANO to cover the edge and expose the central portion to define an emission area per each anode electrode ANO. An emission layer EL is deposited on the bank BA and anode electrode ANO.

The first cathode layer CAT1 is deposited on the emission layer EL. The second cathode layer CAT2 is deposited on the first cathode layer CAT1. The third cathode layer CATS is deposited on the second cathode layer CAT2. Under this condition, a first thickness t1 of the first cathode layer CAT1 deposited at the central region C of the substrate 110 may be thinner than a second thickness t2 of the first cathode layer CAT1 deposited at the right-side region R of the substrate 110. For example, when the thickness of the first cathode layer CAT1 for the low reflection structure is set to 110 Å, the first thickness t1 may be 100 Å, and the second thickness t2 may be 110 Å. Here, the thickness of the first cathode layer CAT1 for low reflection structure may be selected by considering that, for aluminum thin film with a thickness of 110 Å, 50% of incident light is reflected and 50% of the incident light is transmitted. The central region C may refer to the first region, and the right-side region R may refer to the second region. Otherwise, the central region C may refer to the second region, and the right-side region R may refer to the first region.

In this case, at the right-side region R where the first cathode layer CAT1 has thickness of 110 Å for ensuring the low-reflection structure, external light reflection may be suppressed by the mechanism for suppressing the reflected light as shown in FIG. 5. Referring to right-side region R in FIG. 10, when the amount of the incident light ① is 100%, the amount of the first reflected light ② may be 50%, and the amount of the transmitting light ③ may be 50%. Here, the phases of the first reflected light ② and the second reflected light ④ may be adjusted to be opposite to each other by controlling the thicknesses of the second cathode layer CAT2. As shown in the waveforms shown in FIG. 10, at the right-side region R, the amplitude ⓐ' of the first reflected light ② is equal to the amplitude ⓑ' of the second reflected light ④, but the phases are opposite each other. As a result, the external light reflection is suppressed.

Meanwhile, referring to the central region C, the phases of the first reflected light ② and the second reflected light ④ are adjusted to be opposite to each other by the thickness of the second cathode layer CAT2. However, the thickness of the first cathode layer CAT1 is 100 Å thinner than the thickness of 110 Å at right-side region R. Therefore, the amount of first reflected light ② at the central region C may be less than that of the first reflected light ② at the right-side region R. For example, only the amount of light corresponding to 40% of the incident light ① may be the first reflected light ②, because that the thickness of the first cathode layer CAT1 is thinner than that of the right region B. Under this condition, 60% of the incident light ① may become the transmitting light ③, and then become to the second reflected light ④. As the waveform shown at the central region C in FIG. 10, the amplitude ⓐ of the first reflected light ② is smaller than the amplitude ⓑ of the second reflected light ④, and the phases are opposite to each other. As a result, in the central region C, about 10% of the incident light ①, which is the difference between the light amount of the first reflected light ② and the light amount of the second reflected light ④, may be recognized as the external light reflection.

As described above, when the first cathode electrode layer CAT1 is non-uniformly deposited, a difference in external light reflectance occurs, resulting in external light non-uniformity. This may be one of main reasons for deteriorating the display quality of the display device.

The external light reflection suppression structures described in FIGS. 5 to 8 have the structures in which external light reflections are canceled by adjusting or controlling the amount of light of the two reflected light to have the same amplitude but to have opposite phases each other. To do so, a half-transmissive layer is applied. In particular, in the case that the first cathode layer CAT1 having the half-transmissive property is used, a parasitic external reflected light may be occurred due to the non-uniform thickness. Hereinafter, in order to parasitic external light reflection, external light reflection structures are proposed using three reflected light.

Figure 11A:
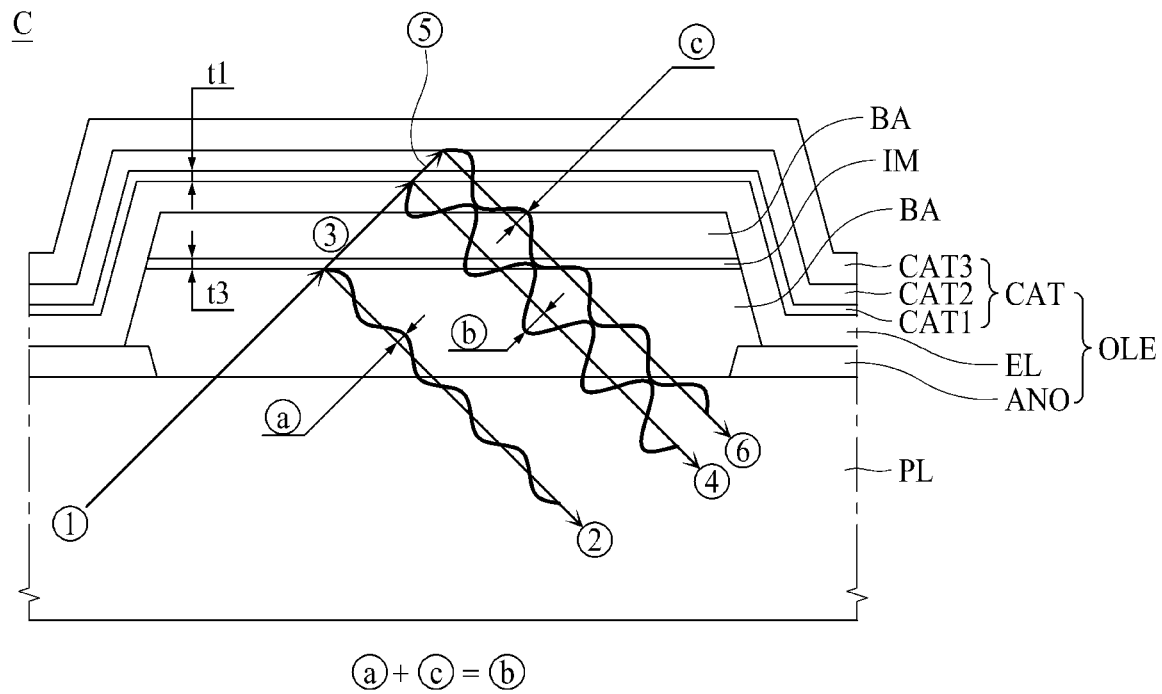
FIG. 11A is an enlarged cross-sectional view illustrating the structure and optical path of a thinner region in which the first cathode layer is relatively thinly deposited, according to a fourth embodiment of the present disclosure.
Figure 11B:
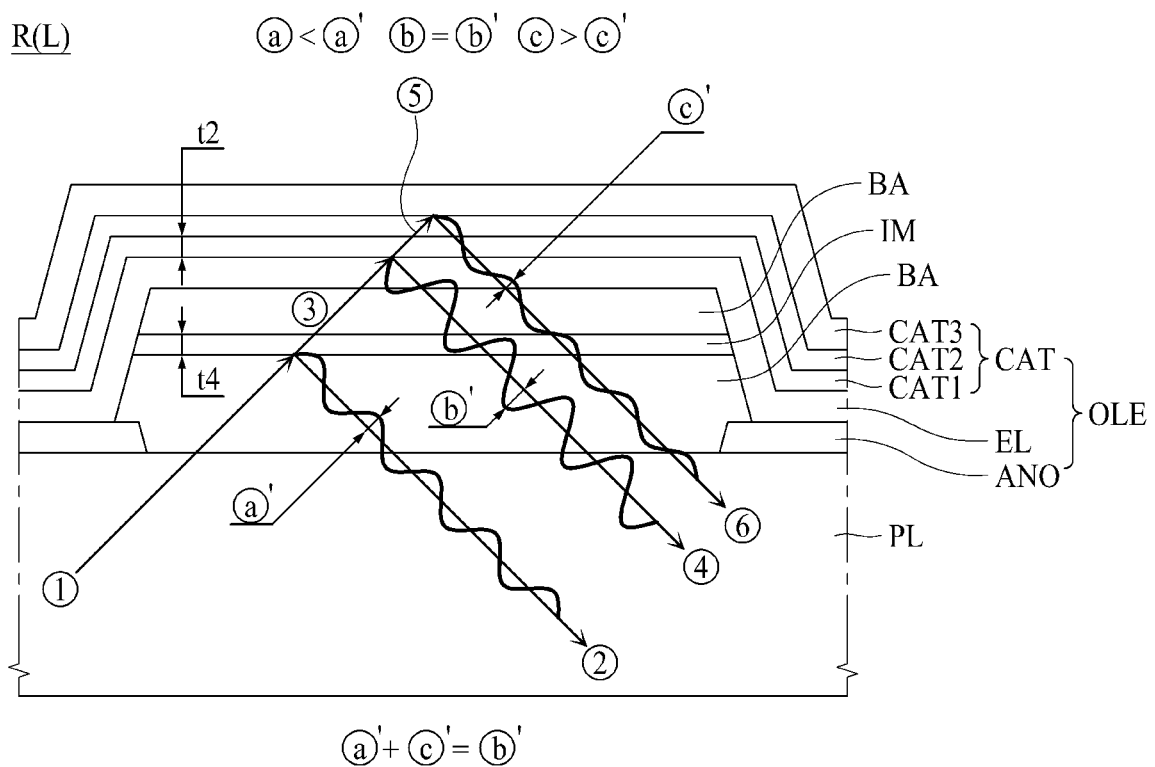
FIG. 11B is an enlarged cross-sectional view illustrating the structure and optical path of a thicker region in which the first cathode layer is relatively thickly deposited, according to the fourth embodiment of the present disclosure.

Hereinafter, referring to FIGS. 11A and 11B, in the fourth embodiment, an external light reflection suppression structure for reducing external light reflection non-uniformity that occurs when the thickness of the first cathode layer CAT1 is not uniformly deposited will be described. FIGS. 11A and 11B are enlarged cross-sectional views illustrating the structures of the light emitting display device according to the fourth embodiment of the present disclosure. FIG. 11A is an enlarged cross-sectional view illustrating the structure and optical path of a central region C in which the first cathode layer is relatively thinly deposited. FIG. 11B is an enlarged cross-sectional view illustrating the structure and optical path of a right-side region R in which the first cathode layer is relatively thickly deposited compared to the central region C.

The fourth embodiment provides a low reflection structure compensating the thickness variations of the first cathode layer CAT1, by configuring the reflectance control layer IM explained in the second and third embodiments with the cathode electrode having low-reflectance structure.

Referring to FIGS. 11A and 11B, at the central region C in which the first cathode layer CAT1 is thinly formed, the anode electrodes ANO are disposed on the planarization layer PL at regular intervals. A bank BA is formed on the anode electrode ANO to cover the edge portions and expose the middle portion. The reflectance control layer IM is disposed within the bank BA. Unlike the third embodiment, the reflectance control layer IM has a structure disposed inside of the bank BA. For example, the reflectance control layer IM may be disposed at an upper portion of the bank BA inside the bank BA. That is, the bank BA may have a first part (e.g., an upper part) and a second part (e.g., a lower part) and the reflectance control layer IM is between the first part and the second part of the bank BA. In one embodiment, the reflectance control layer IM is disposed within the bank BA such that the reflectance control layer IM is closer to an uppermost surface of the bank BA than a lower most surface of the bank BA. Thus, the reflectance control layer I is closer to the cathode electrode CAT than the planarization layer PL. However, it is not limited thereto. The reflectance control layer IM may be disposed at a lower portion of the bank BA inside the bank BA. Since the reflectance control layer IM is for suppressing the reflected light by using the phase difference, it may be set with an appropriate position and condition for ensuring the phase difference.

An emission layer EL is deposited on the bank BA and the anode electrode ANO. The first cathode layer CAT1 is deposited on the emission layer EL. The second cathode layer CAT2 is deposited on the first cathode layer CAT1. The third cathode layer CATS is deposited on the second cathode layer CAT2.

In the fourth embodiment, when the first cathode layer CAT1 is made of aluminum, the thickness of the first cathode layer CAT1 is thicker than 110 Å so that the reflectance by the first cathode layer CAT1 has a value greater than 50%. In this case, the first cathode layer CAT1 may be deposited with a thickness at the central region C that is thinner than a thickness of the first cathode layer CAT1 at the right-side region R. For example, the first cathode layer CAT1 deposited at the central region C may have a first thickness t1, and the first cathode layer CAT1 deposited at the right-side region R may have a second thickness t2. The first thickness t1 may be thinner than the second thickness t2. For example, the first thickness t1 may be 120 Å, and the second thickness may be 150 Å.

In order to compensate for the non-uniform thickness of the first cathode layer CAT1 over the entire substrate 110, the reflectance control layer IM is applied. The reflectance control layer IM may have a third thickness t3 at the central region C, and a fourth thickness t4 at the right-side region R. The third thickness t3 may be thinner than the fourth thickness t4. For example, the third thickness t3 may be 700 Å, and the fourth thickness t4 may be 1,000 Å.

The amount of light reflected from the thinner reflectance control layer IM may be less than the amount of light reflected from the thicker reflectance control layer IM. For example, the reflectance control layer IM having a third thickness t3 applied to the central region C may have a light reflectance of 20%. The reflectance control layer IM having a fourth thickness t4 applied to the right-side region R may have a light reflectance of 30%.

As described above, even when the first cathode layer CAT1 is formed of a metal material, when it has a very thin thickness, some of the incident light may be reflected and the rest may be transmitted. The light transmittance and light reflectance of the first cathode layer CAT1 may be different according to the thicknesses.

The amount of light reflected from the thinner first cathode layer CAT1 may be less than the amount of light reflected from the thicker first cathode layer CAT1. For example, the first cathode layer CAT1 having the first thickness t1 applied to the central region C may have a light reflectance of 62.5%. The first cathode layer CAT1 having the second thickness t2 applied to the right-side region R may have a light reflectance of 71.4%.

Referring to FIG. 11A explaining the central region C (e.g., a first region) of the substrate 110, the incident light ① passing through the substrate 110 and entering into the lower surface of the bank BA (e.g., a first bank portion at the first region) is partially reflected from the lower surface of the reflectance control layer IM (e.g., a first portion of the reflectance control layer IM at the first region) as a first reflected light ②. The reflectance control layer IM does not reflect all of the incident light ① due to a difference in refractive index at the interface with the bank BA. According to the condition described above, only about 20% of the incident light ① is reflected as the first reflected light ②, and the remaining 80% passes through the reflectance control layer IM. The first transmitting light ③ passing through the reflectance control layer IM passes through the emission layer EL and then is partially reflected by the first cathode layer CAT1.

According to the condition described above, 62.5% of the first transmitting light ③ is reflected by the first cathode layer CAT1 and then travels toward the substrate 110 as a second reflected light ④. Therefore, the amount of the second reflected light ④ is 50% of the incident light ①. 37.5% of the first transmitting light ③ passes through the first cathode layer CAT1 and the emission layer EL to become the second transmitting light ⑤. The second transmitting light ⑤ is reflected as the third reflected light ⑥ by the third cathode layer CATS. Therefore, the amount of the third reflected light ⑥ is 30% of the incident light ①. Finally, the total amount of the first reflected light ② and the third reflected light ⑥ is 50% of the incident light ① which is equal to the light amount ratio of the second reflected light ④ to the incident light a 50%.

Here, by adjusting the thickness of the reflectance control layer IM, the phase of the first reflected light ② and the second reflected light ④ are opposite to each other, and by adjusting the thickness of the second cathode layer CAT2, the phases of the second reflected light ④ and the third reflected light ⑥ may be opposite to each other. Referring to waveform shown in FIG. 11A, the sum of the amplitude ⓐ of the first reflected light ② and the amplitude ⓒ of the third reflected light ⑥ is equal to the amplitude ⓑ of the second reflected light ④. The phase of the first reflected light ② and the third reflected light ⑥ are the same, but the phase of the second reflected light ④ is opposite to the phase of the first reflected light ②. As a result, the external light reflectance at the central region C in which the thickness of the first cathode layer CAT1 is thinner may be reduced to 2% or less.

Referring to FIG. 11B explaining the right-side region R (e.g., a second region) of the substrate 110, the incident light ① passing through the substrate 110 and entering into the lower surface of the bank BA (e.g., a second bank portion at the second region) is partially reflected from the lower surface of the reflectance control layer IM (e.g., a second portion of the reflectance control layer IM at the second region) as a first reflected light ②. The reflectance control layer IM does not reflect all of the incident light ① due to a difference in refractive index at the interface with the bank BA. According to the condition described above, only about 30% of the incident light ① is reflected as the first reflected light ②, and the remaining 70% passes through the reflectance control layer IM. The first transmitting light ③ passing through the reflectance control layer IM passes through the emission layer EL and then is partially reflected by the first cathode layer CAT1.

According to the condition described above, 71.4% of the first transmitting light ③ is reflected by the first cathode layer CAT1 and then travels toward the substrate 110 as a second reflected light ④. Therefore, the amount of the second reflected light ④ is 50% of the incident light ①. 28.6% of the first transmitting light ③ passes through the first cathode layer CAT1 and the emission layer EL to become the second transmitting light ⑤. The second transmitting light ⑤ is reflected as the third reflected light ⑥ by the third cathode layer CATS. Therefore, the amount of the third reflected light ⑥ is 20% of the incident light ①. Finally, the total amount of the first reflected light ② and the third reflected light ⑥ is 50% of the incident light ① which is equal to the light amount ratio of the second reflected light ④ to the incident light ①, 50%.

Here, by adjusting the thickness of the reflectance control layer IM, the phase of the first reflected light ② and the second reflected light ④ are opposite to each other, and by adjusting the thickness of the second cathode layer CAT2, the phases of the second reflected light ④ and the third reflected light ⑥ may be opposite to each other. Referring to waveform shown in FIG. 11B, the sum of the amplitude ⓐ' of the first reflected light ② and the amplitude ⓒ' of the third reflected light ⑥ is equal to the amplitude ⓑ' of the second reflected light ④. The phase of the first reflected light ② and the third reflected light ⑥ are the same, but the phase of the second reflected light ④ is opposite to the phase of the first reflected light ②. As a result, the external light reflectance at the right-side region R in which the thickness of the first cathode layer CAT1 is thicker may be reduced to 2% or less.

In the fourth embodiment, considering the non-uniform first cathode layer CAT1, the reflectance control layer IM is applied to the inside of the bank BA. Accordingly, the reflectance of the first cathode layer CAT1 may be adjusted to be more than 50% in consideration of the reflection from the reflectance control layer IM. At this time, the reflectance control layer IM has the same cross-sectional profile in considering of the cross-sectional profile to which the first cathode layer CAT1 is applied.

For example, a cross sectional profile in which the first cathode layer CAT1 is thinner at the central region C of the substrate 110 and thicker at the right-side region R and the left-side region L of the substrate 110 may occur due to manufacturing process conditions. Considering this feature, the reflectance control layer IM may be deposited to follow a profile formed thinner at the central region C of the substrate 110 and thicker at the right-side region R and the left-side region L, similarly to the first cathode layer CAT1. At this time, by adjusting the total thickness of the reflectance control layer IM and controlling the layers interposed under the first cathode layer CAT1, the parasitic external light reflection due to the variations in the thickness of the first cathode layer CAT1 may be compensated.

In the fourth embodiment, a case has been described in which the first cathode layer CAT1 is configured to have a thickness of 150 Å so that 50% of the incident light ① may be reflected by the first cathode layer CAT1. In the fourth embodiment, the description is about the structure for reducing the occurrence of variations in reflectance, when the first cathode layer CAT1 is stacked with a thickness of 120 Å in the central region C of the substrate 110 and 150 Å in both edge regions L and R, even though the first cathode layer CAT1 is deposited to have a thickness of 150 Å.

Fifth Embodiment

In the fifth embodiment, when the first cathode layer CAT1 is made of aluminum, the thickness of the first cathode layer CAT1 is thinner than 110 Å so that the reflectance by the first cathode layer CAT1 has a value less than 50%. In this case, as shown in FIG. 9, the first cathode layer CAT1 may be non-uniformly deposited. For this case, the reflectance control layer IM may be deposited with different profile than that of the fourth embodiment.

Figure 12A:
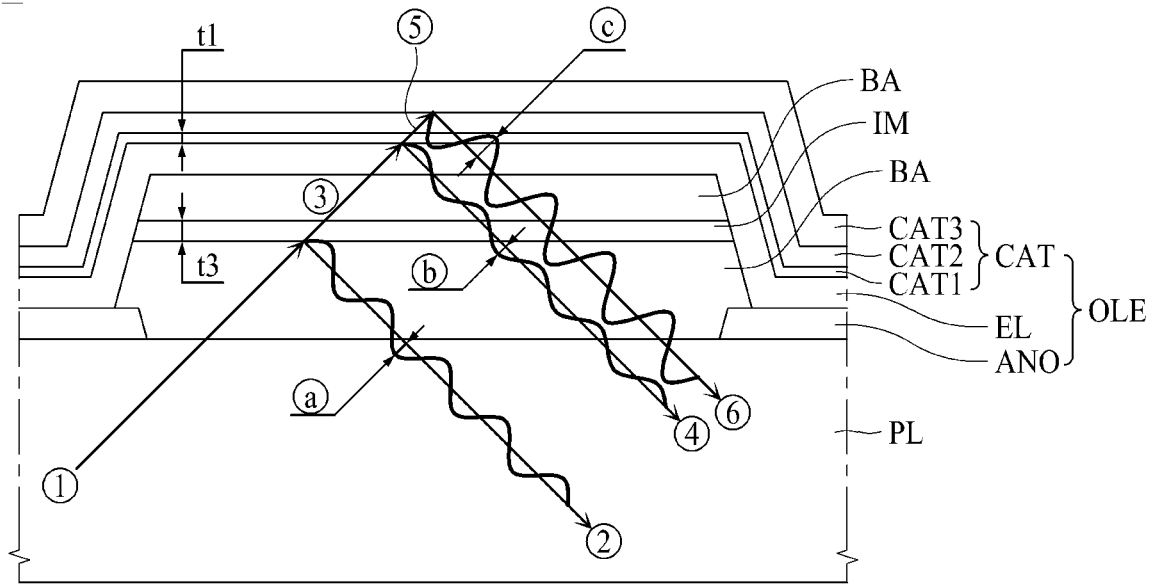
FIG. 12A is an enlarged cross-sectional view illustrating the structure and optical path of a thinner region in which the first cathode layer is relatively thinly deposited, according to a fifth embodiment of the present disclosure.
Figure 12B:
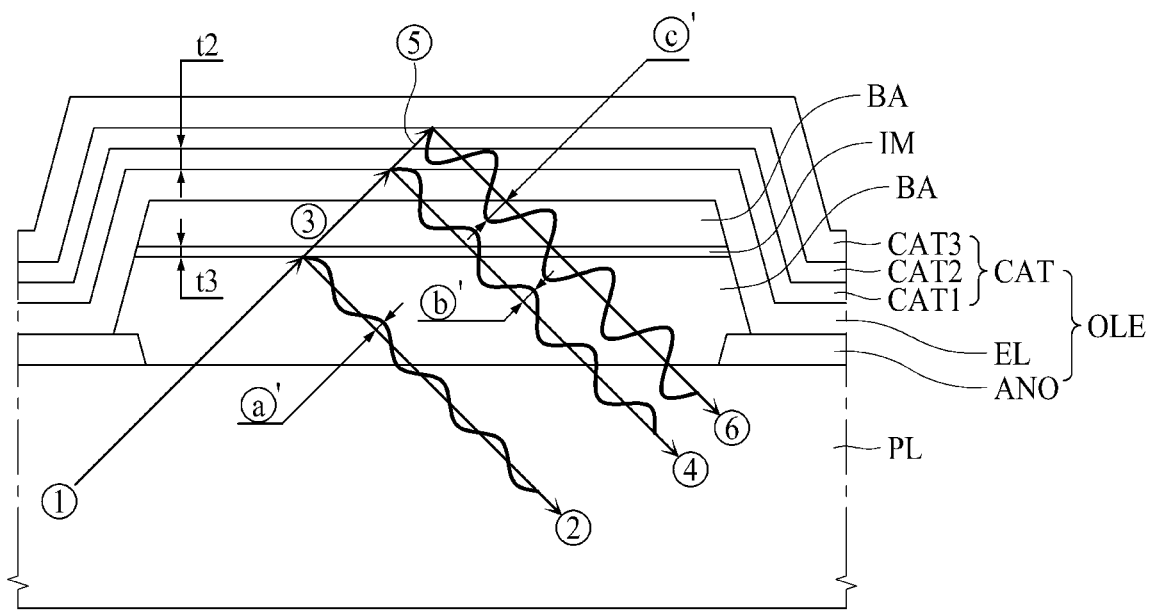
FIG. 12B is an enlarged cross-sectional view illustrating the structure and optical path of a thicker region in which the first cathode layer is relatively thickly deposited, according to the fifth embodiment of the present disclosure.

Hereinafter, referring to FIGS. 12A and 12B, the fifth embodiment of the present disclosure will be described. FIG. 12A is an enlarged cross-sectional view illustrating the structure and optical path of a central region C in which the first cathode layer is relatively thinly deposited, according to the fifth embodiment of the present disclosure. FIG. 12B is an enlarged cross-sectional view illustrating the structure and optical path of a right-side region R in which the first cathode layer is relatively thickly deposited, according to the fifth embodiment of the present disclosure.

Referring to FIGS. 12A and 12B, at the central region C in which the first cathode layer CAT1 is thinly formed, the anode electrodes ANO are disposed on the planarization layer PL at regular intervals. A bank BA is formed on the anode electrode ANO to cover the edge portions and expose the middle portion. The reflectance control layer IM is disposed within the bank BA. Unlike the third embodiment, the reflectance control layer IM is disposed at the upper portion inside of the bank BA.

An emission layer EL is deposited on the bank BA and the anode electrode ANO. The first cathode layer CAT1 is deposited on the emission layer EL. The second cathode layer CAT2 is deposited on the first cathode layer CAT1. The third cathode layer CATS is deposited on the second cathode layer CAT2.

In the fifth embodiment, the first cathode layer CAT1 is deposited with a thickness at the central region C that is thinner than a thickness of the first cathode layer CAT1 at the right-side region R. Conversely, the first cathode layer CAT has a thickness at the right-side region R that is thicker than the first cathode layer CAT at the central region C. The difference is that, in the fifth embodiment, the first cathode layer CAT1 has a thickness of 100 Å thinner than the thickness of 150 Å, in that the reflectance of the first cathode layer CAT1 with the thickness of 100 Å is less than 50%. For example, the first cathode layer CAT1 deposited at the central region C may have a first thickness t1, and the first cathode layer CAT1 deposited at the right-side region R may have a second thickness t2. The first thickness t1 may be thinner than the second thickness t2. For example, the first thickness t1 may be 80 Å, and the second thickness may be 100 Å. The central region C may refer to the first region, and the right-side region R may refer to the second region. Otherwise, the central region C may refer to the second region, and the right-side region R may refer to the first region.

In order to compensate for the non-uniform thickness of the first cathode layer CAT1 over the entire substrate 110, the reflectance control layer IM is deposited. The reflectance control layer IM may have a third thickness t3 at the central region C, and a fourth thickness t4 at the right-side region R. The third thickness t3 may be thicker than the fourth thickness t4. For example, the third thickness t3 may be 1,000 Å, and the fourth thickness t4 may be 700 Å.

The amount of light reflected from the thinner reflectance control layer IM may be less than the amount of light reflected from the thicker reflectance control layer IM. For example, the reflectance control layer IM having a third thickness t3 applied to the central region C may have a light reflectance of 30%. The reflectance control layer IM having a fourth thickness t4 applied to the right-side region R may have a light reflectance of 20%.

The amount of light reflected from the thinner first cathode layer CAT1 may be less than the amount of light reflected from the thicker first cathode layer CAT1. For example, the first cathode layer CAT1 having the first thickness t1 applied to the central region C may have a light reflectance of 28.6%. The first cathode layer CAT1 having the second thickness t2 applied to the right-side region R may have a light reflectance of 37.5%.

Referring to FIG. 12A explaining the central region C (e.g., a first region) of the substrate 110, the incident light ① passing through the substrate 110 and entering into the lower surface of the bank BA (e.g., a first bank portion at the first region) is partially reflected from the lower surface of the reflectance control layer IM (e.g., a first portion of the reflectance control layer IM at the first region) as a first reflected light ②. The reflectance control layer IM does not reflect all of the incident light ① due to a difference in refractive index at the interface with the bank BA. According to the condition described above, only about 30% of the incident light ① is reflected as the first reflected light ②, and the remaining 70% passes through the reflectance control layer IM. The first transmitting light ③ passing through the reflectance control layer IM passes through the emission layer EL and then is partially reflected by the first cathode layer CAT1.

According to the condition described above, 28.6% of the first transmitting light ③ is reflected by the first cathode layer CAT1 and then travels toward the substrate 110 as a second reflected light ④. Therefore, the amount of the second reflected light ④ is 20% of the incident light ①. 71.4% of the first transmitting light ③ passes through the first cathode layer CAT1 and the emission layer EL to become the second transmitting light ⑤. The second transmitting light ⑤ is reflected as the third reflected light ⑥ by the third cathode layer CATS. Therefore, the amount of the third reflected light ⑥ is 50% of the incident light ①. Finally, the total amount of the first reflected light ② and the second reflected light ④ is 50% of the incident light ① which is equal to the light amount ratio of the third reflected light ⑥ to the incident light ①, 50%.

Here, by adjusting the thickness of the reflectance control layer IM, the phase of the first reflected light ② and the second reflected light ④ are same with each other, and by adjusting the thickness of the second cathode layer CAT2, the phases of the second reflected light ④ and the third reflected light ⑥ may be opposite to each other. Referring to waveform shown in FIG. 12A, the sum of the amplitude ⓐ of the first reflected light ② and the amplitude ⓑ of the second reflected light ④ is equal to the amplitude ⓒ of the third reflected light ⑥. The phase of the first reflected light ② and the second reflected light ④ are the same, but the phase of the second reflected light ④ is opposite to the phase of the third reflected light ⑥. As a result, the external light reflectance at the central region C in which the thickness of the first cathode layer CAT1 is thinner may be reduced to 2% or less.

Referring to FIG. 12B explaining the right-side region R (e.g., a second region) of the substrate 110, the incident light ① passing through the substrate 110 and entering into the lower surface of the bank BA (e.g., a second bank portion at the second region) is partially reflected from the lower surface of the reflectance control layer IM (e.g., a second portion of the reflectance control layer IM at the second region) as a first reflected light ②. The reflectance control layer IM does not reflect all of the incident light ① due to a difference in refractive index at the interface with the bank BA. According to the condition described above, only about 20% of the incident light ① is reflected as the first reflected light ②, and the remaining 80% passes through the reflectance control layer IM. The first transmitting light ③ passing through the reflectance control layer IM passes through the emission layer EL and then is partially reflected by the first cathode layer CAT1.

According to the condition described above, 37.5% of the first transmitting light ③ is reflected by the first cathode layer CAT1 and then travels toward the substrate 110 as a second reflected light ④. Therefore, the amount of the second reflected light ④ is 30% of the incident light ①. 62.5% of the first transmitting light ③ passes through the first cathode layer CAT1 and the emission layer EL to become the second transmitting light ⑤. The second transmitting light ⑤ is reflected as the third reflected light ⑥ by the third cathode layer CATS. Therefore, the amount of the third reflected light ⑥ is 50% of the incident light ①. Finally, the total amount of the first reflected light ② and the second reflected light ④ is 50% of the incident light ① which is equal to the light amount ratio of the third reflected light ⑥ to the incident light ①, 50%.

Here, by adjusting the thickness of the reflectance control layer IM, the phase of the first reflected light ② and the second reflected light ④ are same with each other, and by adjusting the thickness of the second cathode layer CAT2, the phases of the second reflected light ④ and the third reflected light ⑥ may be opposite to each other. Referring to waveform shown in FIG. 12B, the sum of the amplitude ⓐ' of the first reflected light ② and the amplitude ⓑ' of the second reflected light ④ is equal to the amplitude ⓒ' of the third reflected light ⑥. The phase of the first reflected light ② and the second reflected light ④ are the same, but the phase of the third reflected light ⑥ is opposite to the phase of the first reflected light ②. As a result, the external light reflectance at the right-side region R in which the thickness of the first cathode layer CAT1 is thicker may be reduced to 2% or less.

In the fourth embodiment, considering the non-uniform first cathode layer CAT1, the reflectance control layer IM is applied to the inside of the bank BA. Accordingly, the reflectance of the first cathode layer CAT1 may be adjusted to be less than 50% in consideration of the reflection from the reflectance control layer IM. At this time, the reflectance control layer IM has the opposite cross-sectional profile in considering of the cross-sectional profile to which the first cathode layer CAT1 is applied.

For example, a cross sectional profile in which the first cathode layer CAT1 is thinner at the central region C of the substrate 110 and thicker at the right-side region R and the left-side region L of the substrate 110 may occur due to manufacturing process conditions. Considering this feature, the reflectance control layer IM may be deposited to follow a profile formed thicker at the central region C of the substrate 110 and thinner at the right-side region R and the left-side region L, contrarily to the first cathode layer CAT1. At this time, by adjusting the total thickness of the reflectance control layer IM and controlling the layers interposed under the first cathode layer CAT1, the parasitic external light reflection due to the variations in the thickness of the first cathode layer CAT1 may be compensated.

In the fourth and fifth embodiments, only the case in which the reflectance control layer IM is formed on the bank BA, but the present disclosure is not limited thereto. The same effect may be obtained by disposing the reflectance control layer IM in the planarization layer PL described in the second embodiment. As a result, by compensating for the parasite external light reflection due to the thickness deviation of the first cathode layer CAT1 with the reflectance control layer IM, the external light reflection may be suppressed within the designed tolerance range of 2%.

Comparing the fourth embodiment with the fifth embodiment described above, in the case of the fourth embodiment, the phases of the first reflected light ② and the second reflected light ④ are opposite, whereas in the case of the fifth embodiment, the phase of the first reflected light ② and the second reflected light ④ are the same.

The upper portion of the bank BA and the emission layer EL are interposed between the first reflected light ② and the second reflected light ④. Here, the thickness of the emission layer EL may be determined according to a structure in which the light emitting diode OLE is formed. Therefore, depending on the thickness of the emission layer EL, the first reflected light ② and the second reflected light ④ may have opposite phases or may be the same.

Accordingly, when the phases of the first reflected light ② and the second reflected light ④ are opposite due to the thickness of the emission layer EL, the structure according to the fourth embodiment may be applied. Meanwhile, when the phase of the first reflected light ② and the second reflected light ④ are the same, the structure according to the fifth embodiment is applied.

The features, structures, effects and so on described in the above example embodiments of the present disclosure are included in at least one example embodiment of the present disclosure, and are not necessarily limited to only one example embodiment. Furthermore, the features, structures, effects and the like explained in at least one example embodiment may be implemented in combination or modification with respect to other example embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific example embodiments disclosed in the specification and the claims, but should be construed to include all possible embodiments along with the full scope of equivalents to which such claims are entitled. Accordingly, the claims are not limited by the disclosure.

What is claimed is:

1. A light emitting display device comprising:
    a driving layer on a substrate, the driving layer including a transistor;
    a planarization layer on the driving layer;
    a plurality of anode electrodes on the planarization layer;
    a bank between the plurality of anode electrodes, the bank defining an emission area;
    an emission layer on the bank and the plurality of anode electrodes;
    a cathode electrode on the emission layer and the bank; and
    a reflectance control layer at any one of the bank or the planarization layer, the reflectance control layer having a refraction index that is different from a refraction index of the bank and a refraction index of the planarization layer,
    wherein the cathode electrode includes:
        a first cathode layer on the emission layer;
        a second cathode layer on the first cathode layer; and
        a third cathode layer on the second cathode layer,
        wherein the first cathode layer has a first thickness at a first region of the substrate, and a second thickness that is thicker than the first thickness at a second region of the substrate.

2. The light emitting display device according to claim 1, wherein the first cathode layer includes a first metal material having a thickness in a range of 100 Å to 200 Å, the second cathode layer includes a conductive resin material having a domain material and a dopant, and the third cathode layer includes a second metal material having a thickness in a range of 2,000 Å to 4,000 Å.

3. The light emitting display device according to claim 1, wherein the reflectance control layer has a third thickness at the first region of the substrate, and a fourth thickness that is thicker than the third thickness at the second region of the substrate.

4. The light emitting display device according to claim 3, wherein, in the first region, a total amount of a first reflected light from the reflectance control layer and a third reflected light from the third cathode layer is equal to a total amount of second reflected light from the first cathode layer, and phases of the first reflected light and the third reflected light are a same, and phases of the second reflected light and the first reflected light are opposite to each other.

5. The light emitting display device according to claim 3, wherein, in the second region, a total amount of a first reflected light from the reflectance control layer and a third reflected light from the third cathode layer is equal to a total amount of second reflected light from the first cathode layer, and phases of the first reflected light and the third reflected light are a same, and phases of the second reflected light and the first reflected light are opposite to each other.

6. The light emitting display device according to claim 1, wherein the reflectance control layer is within the bank.

7. The light emitting display device according to claim 1, wherein the reflectance control layer is within the planarization layer.

8. The light emitting display device according to claim 1, wherein the driving layer comprises a plurality of signal lines including:
    a first metal layer; and
    a second metal layer on the first metal layer.

9. The light emitting display device according to claim 8, wherein an amount of a first reflected light from the first metal layer is different from an amount of a second reflected light from the second metal layer, and phases of the first reflected light and the second reflected light are opposite to each other.

10. The light emitting display device according to claim 8, wherein the first metal layer includes a metal oxide material having a thickness of 100 Å to 500 Å, and the second metal layer includes a metal material having a thickness of 2,000 Å to 4,000 Å.

11. A light emitting display device comprising:
    a substrate;
    a planarization layer on the substrate;
    a plurality of anode electrodes on the planarization layer;
    a bank between the plurality of anode electrodes to define emission areas of a light emitting device, the bank including a first bank portion at a first region of the substrate and a second bank portion at a second region of the substrate that is different from the first region of the substrate;
    an emission layer on the bank and the plurality of anode electrodes;
    a cathode electrode on the bank and the emission layer; and
    a reflectance control layer on the bank such that the reflectance control layer is between the emission layer and the planarization layer, the reflectance control layer having an index of refraction that is different from the bank,
    wherein a first portion of the cathode electrode that is on the first bank portion in the first region has a first thickness that is less than a second thickness of a second portion of the cathode electrode that is on the second bank portion in the second region, and
    wherein a first thickness of a first portion of the reflectance control layer that is in the first region is different from a second thickness of a second portion of the reflectance control layer that is in the second region.

12. The light emitting display device of claim 11, wherein the first thickness of the first portion of the reflectance control layer that is on the first bank portion in the first region is less than the second thickness of the second portion of the reflectance control layer that is on the second bank portion in the second region.

13. The light emitting display device of claim 11, wherein the first thickness of the first portion of the reflectance control layer that is on the first bank portion in the first region is greater than the second thickness of the second portion of the reflectance control layer that is on the second bank portion in the second region.

14. The light emitting display device of claim 11, where the first portion of the reflectance control layer is within the first bank portion, and the second portion of the reflectance control layer is within the second bank portion.

15. The light emitting display device of claim 14, wherein the first bank portion includes a first part and a second part, and the first portion of the reflectance control layer is between the first part and the second part of the first bank portion, and wherein the second bank portion includes a first part and a second part, and the second portion of the reflectance control layer is between the first part and the second part of the second bank portion.

16. The light emitting display device of claim 14, wherein the first portion of the reflectance control layer is within the first bank portion such that the first portion of the reflectance control layer is closer to the cathode electrode than the planarization layer, and the second portion of the reflectance control layer is within the second bank portion such that the second portion of the reflectance control layer is closer to the cathode electrode than the planarization layer.

17. The light emitting display device of claim 11, wherein the cathode electrode comprises:

a first cathode layer on the emission layer;
a second cathode layer on the first cathode layer; and
a third cathode layer on the second cathode layer.

18. The light emitting display device of claim 17, wherein the first cathode layer includes a first metal material having a thickness in a range of 100 Å to 200 Å, the second cathode layer includes a conductive resin material having a domain material and a dopant, and the third cathode layer includes a second metal material having a thickness in a range of 2,000 Å to 4,000 Å.

\* \* \* \* \*